US011018152B2

(12) United States Patent
Hinoue et al.

(10) Patent No.: US 11,018,152 B2
(45) Date of Patent: May 25, 2021

(54) METHOD FOR ETCHING BOTTOM PUNCH-THROUGH OPENING IN A MEMORY FILM OF A MULTI-TIER THREE-DIMENSIONAL MEMORY DEVICE

(71) Applicant: SANDISK TECHNOLOGIES LLC, Addison, TX (US)

(72) Inventors: Tatsuya Hinoue, Odawara (JP); Kengo Kajiwara, Yokkaichi (JP); Ryousuke Itou, Yokkaichi (JP); Naohiro Hosoda, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/503,884

(22) Filed: Jul. 5, 2019

(65) Prior Publication Data
US 2021/0005627 A1  Jan. 7, 2021

(51) Int. Cl.
| | |
|---|---|
| H01L 27/11582 | (2017.01) |
| H01L 27/11565 | (2017.01) |
| H01L 27/11524 | (2017.01) |
| H01L 27/11556 | (2017.01) |
| H01L 27/11519 | (2017.01) |
| H01L 27/1157 | (2017.01) |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
None
See application file for complete search history.

(56) References Cited

U.S. PATENT DOCUMENTS

| | | | |
|---|---|---|---|
| 6,735,134 | B2 | 5/2004 | Park |
| 8,614,126 | B1 | 12/2013 | Lee et al. |
| 8,884,357 | B2 | 11/2014 | Wang et al. |
| 8,946,023 | B2 | 2/2015 | Makala et al. |

(Continued)

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).

(Continued)

*Primary Examiner* — Sitaramarao S Yechuri
(74) *Attorney, Agent, or Firm* — The Marbury Law Group PLLC

(57) ABSTRACT

First memory openings are formed through a first alternating stack of first insulating layers and first spacer material layers. Each first memory opening is filled with a first memory film, a sacrificial dielectric liner, and a first-tier opening fill material portion. Second memory openings are formed through a second alternating stack of second insulating layers and second spacer material layers. A second memory film is formed in each second memory opening. The first-tier opening fill material portions are removed selective to the sacrificial dielectric liners. The sacrificial dielectric liners are removed selective to the second memory films and the first memory films. A vertical semiconductor channel can be formed on each vertical stack of a first memory film and a second memory film.

19 Claims, 26 Drawing Sheets

(56) References Cited

U.S. PATENT DOCUMENTS

| | | | |
|---|---|---|---|
| 9,023,719 B2 | 5/2015 | Pachamuthu et al. | |
| 9,230,979 B1 | 1/2016 | Pachamuthu et al. | |
| 9,230,987 B2 | 1/2016 | Pachamuthu et al. | |
| 9,406,690 B2 | 8/2016 | Pang et al. | |
| 9,437,606 B2 | 9/2016 | Makala et al. | |
| 9,449,982 B2 | 9/2016 | Lu et al. | |
| 9,460,931 B2 | 10/2016 | Pachamuthu et al. | |
| 9,502,471 B1 | 11/2016 | Lu et al. | |
| 9,524,976 B2 | 12/2016 | Pachamuthu et al. | |
| 9,530,788 B2 | 12/2016 | Oginoe et al. | |
| 9,570,463 B1 | 2/2017 | Zhang et al. | |
| 9,627,403 B2 | 4/2017 | Liu et al. | |
| 9,711,524 B2 | 7/2017 | Shoji et al. | |
| 9,728,551 B1 | 8/2017 | Lu et al. | |
| 9,754,963 B1 | 9/2017 | Kawamura et al. | |
| 9,786,681 B1 | 10/2017 | Ariyoshi | |
| 9,853,043 B2 | 12/2017 | Lu et al. | |
| 9,859,363 B2 | 1/2018 | Lu et al. | |
| 9,881,929 B1 | 1/2018 | Ravikirthi et al. | |
| 9,935,050 B2 | 4/2018 | Dunga et al. | |
| 9,960,181 B1 | 5/2018 | Cui et al. | |
| 9,978,766 B1 | 5/2018 | Hosoda et al. | |
| 9,991,280 B2 | 6/2018 | Nakamura et al. | |
| 10,103,169 B1 | 10/2018 | Ge et al. | |
| 10,115,732 B2 | 10/2018 | Yu et al. | |
| 10,269,620 B2 | 4/2019 | Yu et al. | |
| 2003/0058722 A1 | 3/2003 | Park | |
| 2011/0312174 A1* | 12/2011 | Lee | H01L 27/11582 438/595 |
| 2014/0264525 A1* | 9/2014 | Takahashi | H01L 27/11563 257/314 |
| 2015/0076580 A1 | 3/2015 | Pachamuthu et al. | |
| 2015/0236038 A1 | 8/2015 | Pachamuthu et al. | |
| 2015/0294978 A1 | 10/2015 | Lu et al. | |
| 2016/0005760 A1* | 1/2016 | Lee | H01L 27/1157 257/324 |
| 2016/0172368 A1 | 6/2016 | Pang et al. | |
| 2016/0204122 A1 | 7/2016 | Shoji et al. | |
| 2016/0322381 A1 | 11/2016 | Liu et al. | |
| 2017/0062454 A1* | 3/2017 | Lu | H01L 29/7926 |
| 2017/0229472 A1 | 8/2017 | Lu et al. | |
| 2017/0236746 A1 | 8/2017 | Yu et al. | |
| 2017/0236835 A1 | 8/2017 | Nakamura et al. | |
| 2017/0236896 A1* | 8/2017 | Lu | H01L 27/11582 257/314 |
| 2017/0243879 A1 | 8/2017 | Yu et al. | |
| 2017/0271352 A1* | 9/2017 | Nakamura | H01L 27/1157 |
| 2017/0287926 A1 | 10/2017 | Ariyoshi et al. | |
| 2017/0294377 A1 | 10/2017 | Dunga et al. | |
| 2018/0130812 A1* | 5/2018 | Hosoda | H01L 27/11517 |
| 2018/0374865 A1 | 12/2018 | Shimabukuro et al. | |
| 2019/0198522 A1* | 6/2019 | Takekida | H01L 27/1157 |

OTHER PUBLICATIONS

Wet Etching of Silicon and SiO$_2$, Basics of Microstructuring, www.MicroChemicals.com/downloads/application_notes.html, visited Jul. 3, 2019.

U.S. Appl. No. 15/914,560, filed Mar. 7, 2018, SanDisk Technologies LLC.

U.S. Appl. No. 16/002,265, filed Jun. 7, 2018, SanDisk Technologies LLC.

U.S. Appl. No. 16/019,677, filed Jun. 27, 2018, SanDisk Technologies LLC.

U.S. Appl. No. 16/224,367, filed Dec. 18, 2018, SanDisk Technologies LLC.

U.S. Appl. No. 16/276,952, filed Feb. 15, 2019, SanDisk Technologies LLC.

U.S. Appl. No. 16/276,996, filed Feb. 15, 2019, SanDisk Technologies LLC.

* cited by examiner

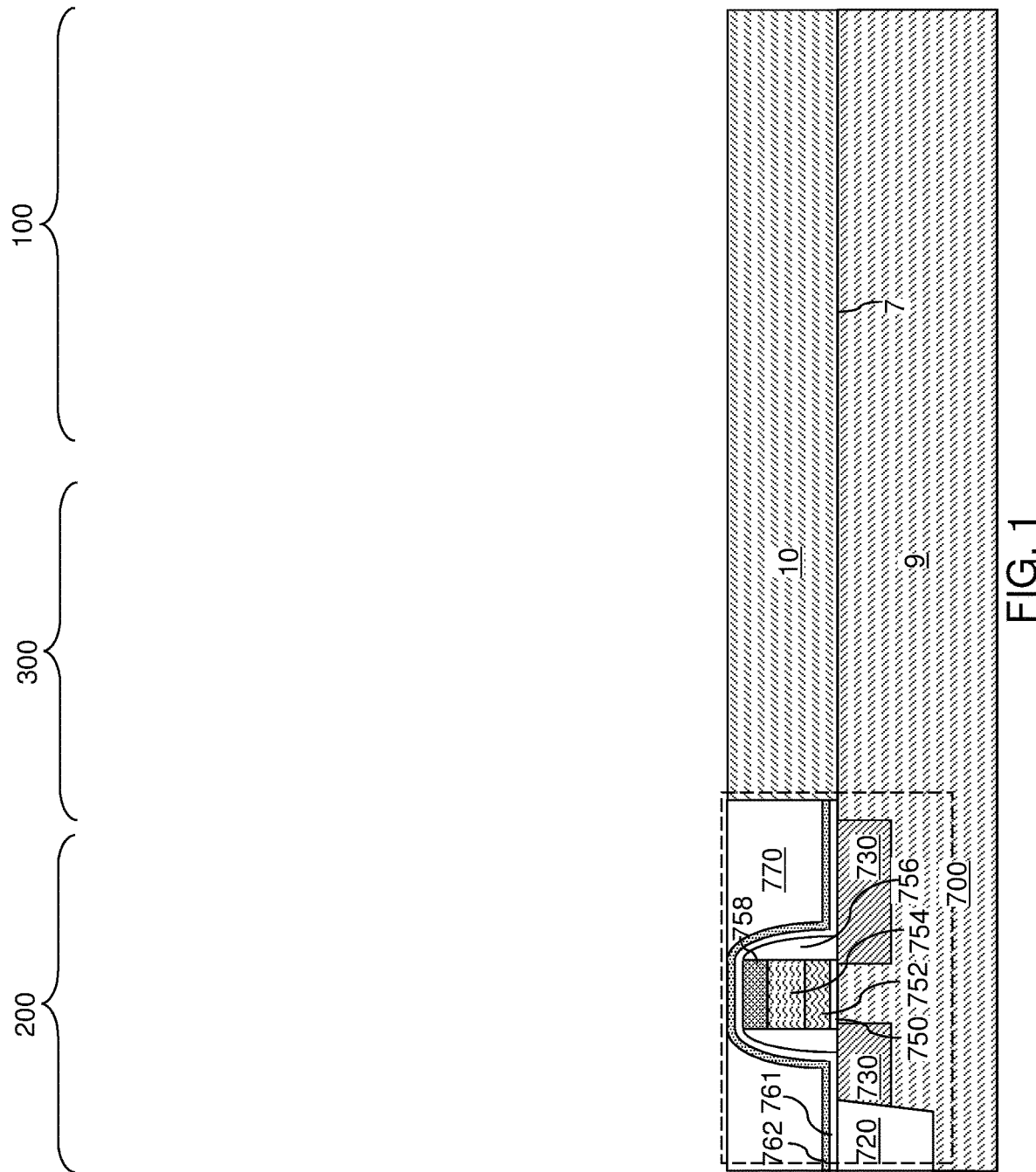

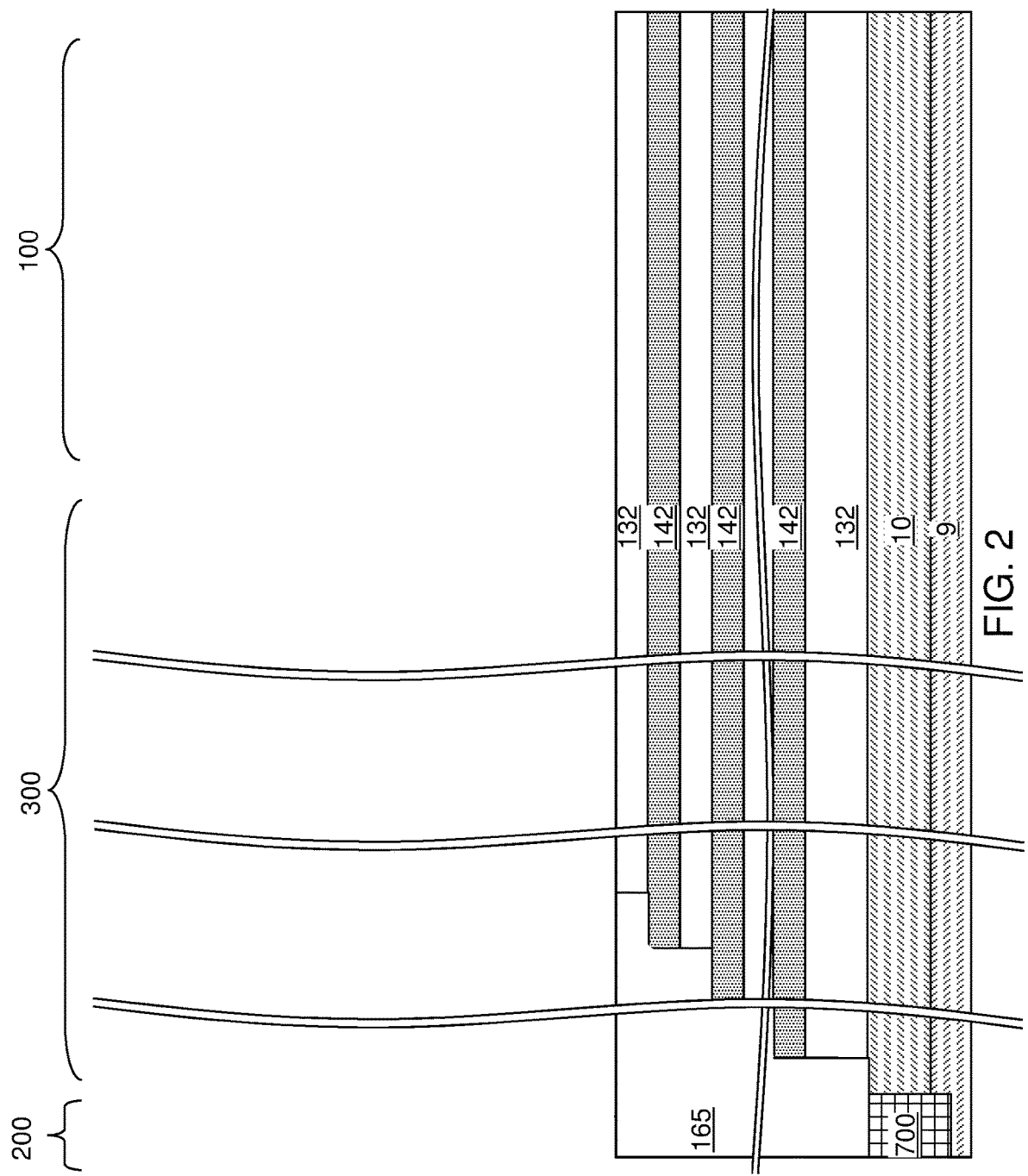

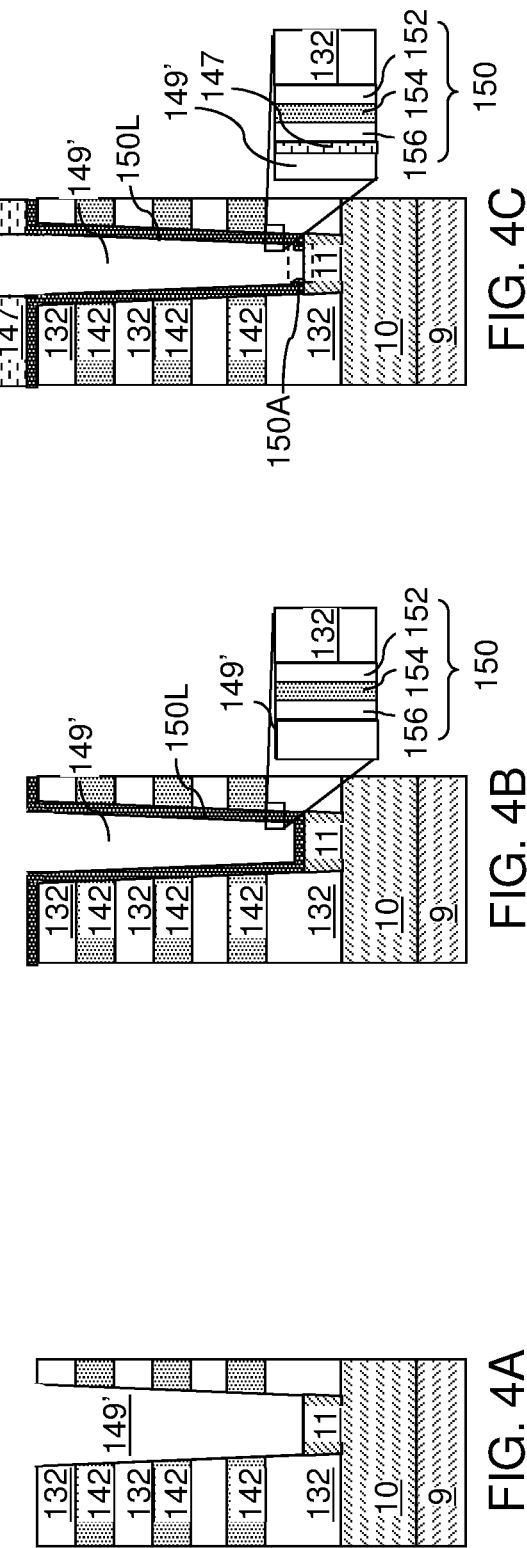
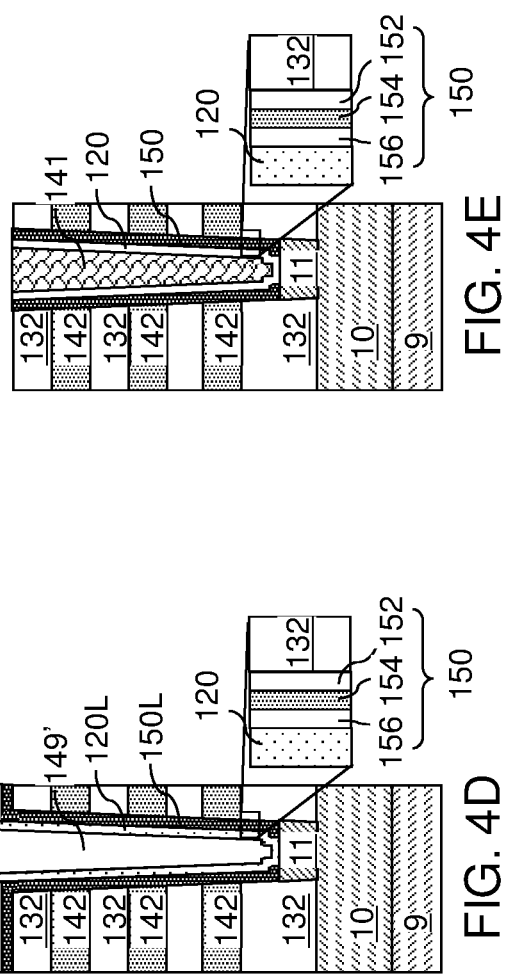
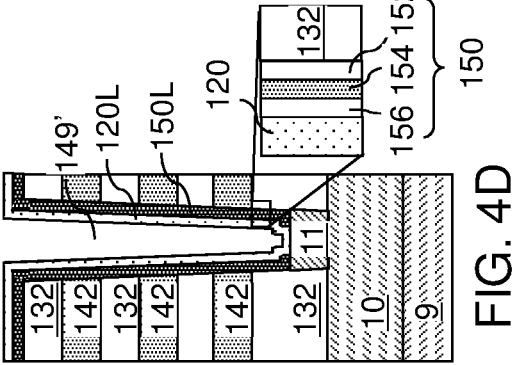

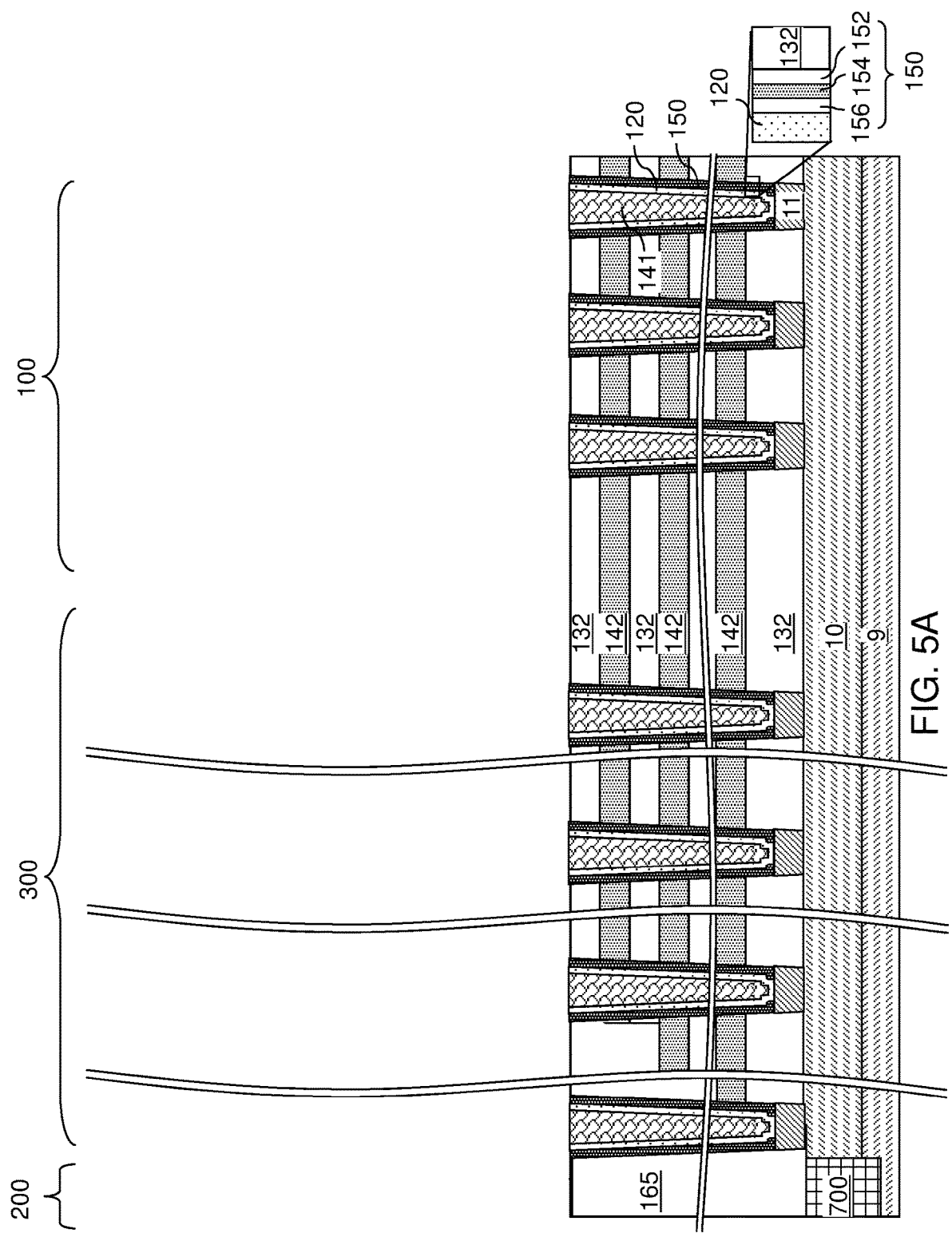

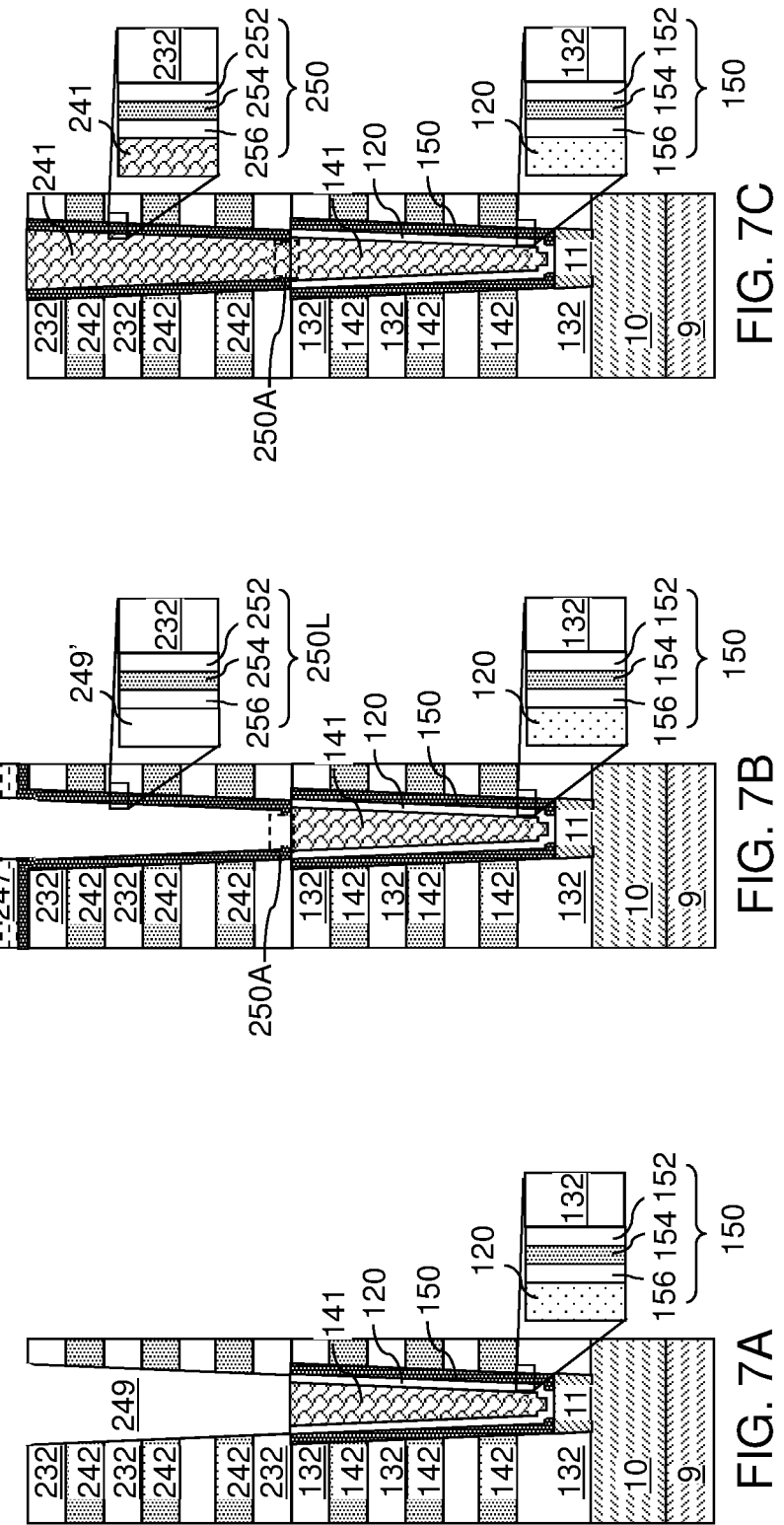

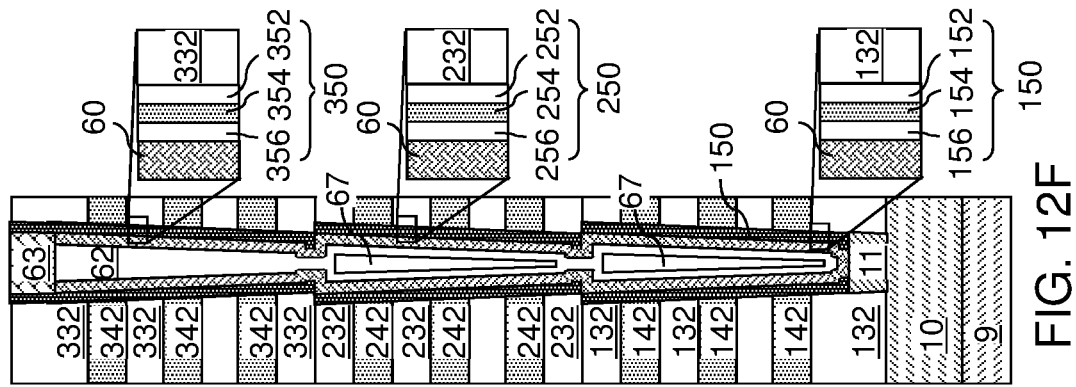
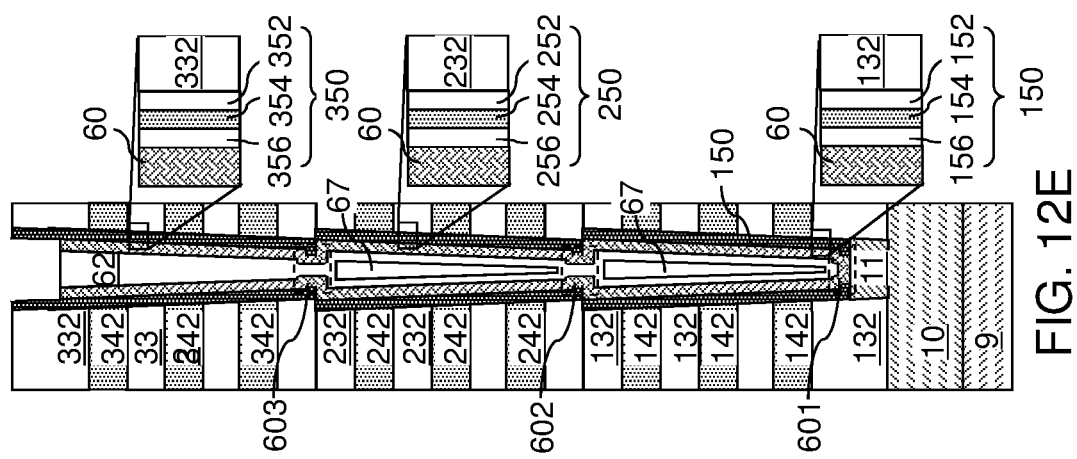
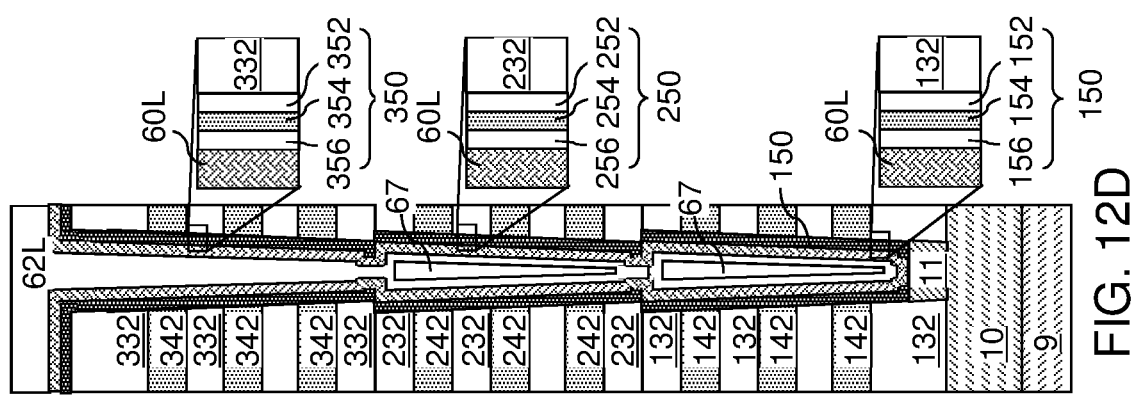
FIG. 12F
FIG. 12E
FIG. 12D

METHOD FOR ETCHING BOTTOM PUNCH-THROUGH OPENING IN A MEMORY FILM OF A MULTI-TIER THREE-DIMENSIONAL MEMORY DEVICE

FIELD

The present disclosure relates generally to the field of semiconductor devices, and particular to a method for etching a bottom punch-through opening in a memory film of a multi-tier three-dimensional memory device, and a multi-tier three-dimensional memory device formed by the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a three-dimensional memory device is provided, which comprises: forming a first alternating stack of first insulating layers and first spacer material layers over a semiconductor material layer; forming first memory openings through the first alternating stack, wherein a top surface of the semiconductor material layer is physically exposed at a bottom of each of the first memory openings; filling each of the first memory openings with a respective combination of material portions comprising a first memory film, a sacrificial liner, and a first-tier opening fill material portion; forming a second alternating stack of second insulating layers and second spacer material layers over the first alternating stack and the first-tier opening fill material portions; forming second memory openings through the second alternating stack, wherein a top surface of a respective one of the first-tier opening fill material portions is physically exposed at a bottom of each of the second memory openings; forming a second memory film within each of the second memory openings; removing the first-tier opening fill material portions selective to the sacrificial liners; removing the sacrificial liners selective to the second memory films and the first memory films; and forming a vertical semiconductor channel on each vertical stack of a first memory film and a second memory film.

According to another aspect of the present disclosure, a three-dimensional memory device is provided, which comprises: a first alternating stack of first insulating layers and first electrically conductive layers over a semiconductor material layer; a second alternating stack of second insulating layers and second electrically conductive layers overlying the first alternating stack; a first memory opening extending through the first alternating stack and including a first memory film at a peripheral portion thereof; a second memory opening extending through the second alternating stack and including a second memory film at a peripheral portion thereof; and a vertical semiconductor channel extending through the first memory opening and the second memory opening and contacting inner sidewalls of the first memory film and the second memory film, wherein the first memory film comprises a horizontal annular portion that laterally protrudes inward from a bottom end of a cylindrical portion of the first memory film.

BRIEF DESCRIPTION OF THE DRAWINGS

FIG. 1 is a schematic vertical cross-sectional view of an exemplary structure after formation of at least one peripheral device and a semiconductor material layer according to an embodiment of the present disclosure.

FIG. 2 is a schematic vertical cross-sectional view of the exemplary structure after formation of a first alternating stack of first insulating layers and first spacer material layers, first stepped surfaces, and a first retro-stepped dielectric material portion according to an embodiment of the present disclosure.

FIGS. 4A-4E are sequential schematic vertical cross-sectional views of a first memory opening during formation of a first in-process memory opening fill structure according to an embodiment of the present disclosure.

FIG. 5A is a schematic vertical cross-sectional view of the exemplary structure after formation of first in-process memory opening fill structures according to an embodiment of the present disclosure.

FIGS. 7A-7C are sequential schematic vertical cross-sectional views of a second memory opening during formation of a second in-process memory opening fill structure according to an embodiment of the present disclosure.

FIGS. 12A-12F are sequential schematic vertical cross-sectional views of a third memory opening during formation of a memory opening fill structure according to an embodiment of the present disclosure.

DETAILED DESCRIPTION

Figure 3A:
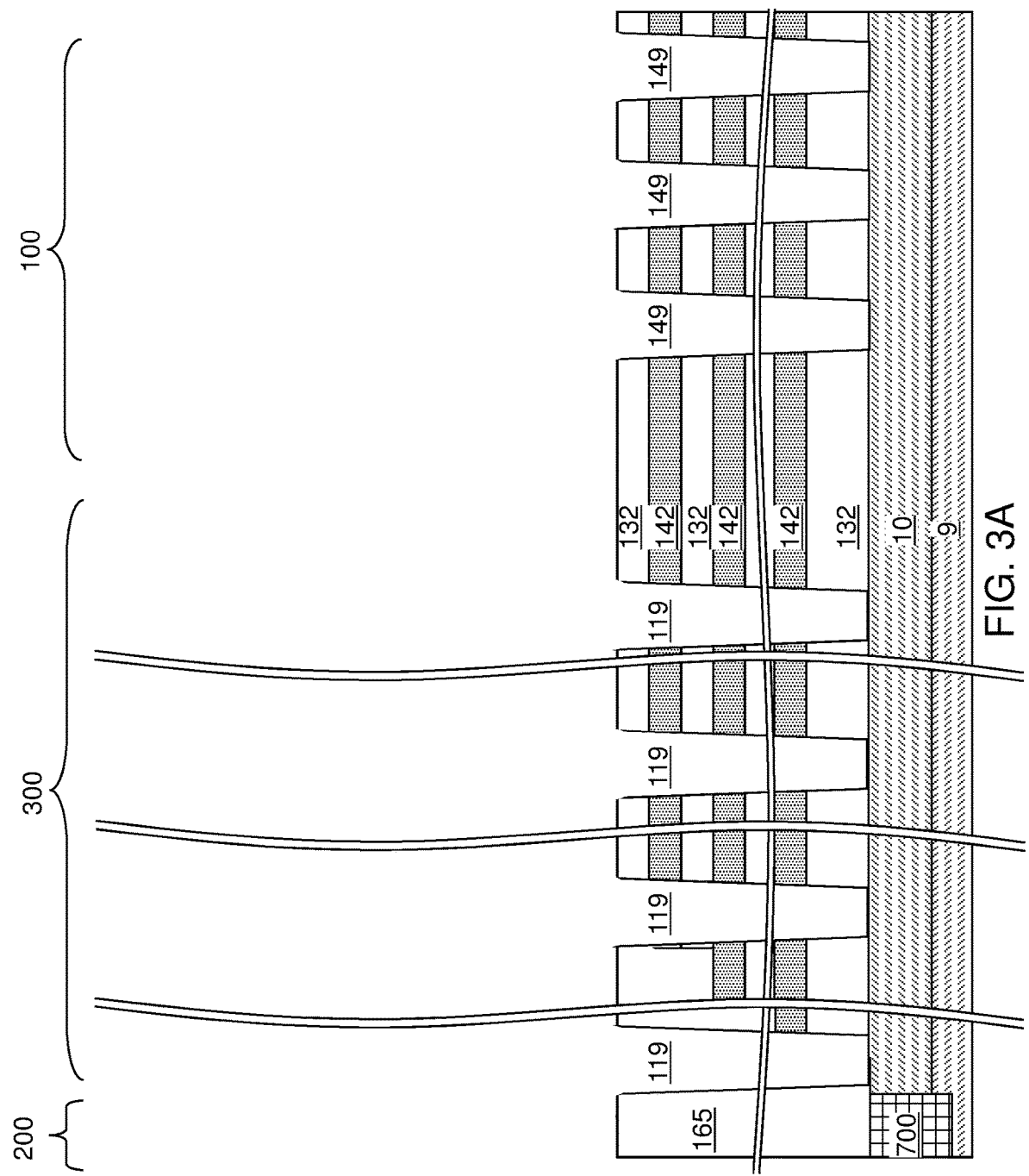
FIG. 3A is a schematic vertical cross-sectional view of the exemplary structure after formation of first memory openings according to an embodiment of the present disclosure.

As discussed above, the present disclosure is directed to a method for etching a bottom punch-through opening in a memory film of a multi-tier three-dimensional memory device using a sacrificial liner, and a multi-tier three-dimensional memory array formed by the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants therein. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped surfaces of electrically conductive layers can be provided between the memory array region 100 and the peripheral device region 200. In an alternative embodiment, the peripheral device region 200 containing the at least one semiconductor device 700 is not formed on the same substrate (9, 10) as the memory array region 100. Instead, the peripheral device region 200 containing the at least one semiconductor device 700 is formed on a separate substrate and is then bonded to the substrate (9, 10) containing the memory array region 100.

Referring to FIG. 2, a stack of an alternating plurality of first insulating layers 132 and first spacer material layers (which may be first sacrificial material layer 142) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses.

The stack of the alternating plurality is herein referred to as a first alternating stack (132, 142). Insulating materials that can be employed for the first insulating layers 132 include, but are not limited to, silicate glass materials (including doped or undoped silicate glass (e.g., silicon oxide)), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 can be silicon oxide.

The first spacer material layers can be formed as first electrically conductive layers, or can be formed as the first sacrificial material layers 142 that are subsequently replaced with first electrically conductive layers. In case the first sacrificial material layers 142 are employed, the first sacrificial material layers 142 includes a sacrificial material that can be removed selective to the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The first sacrificial material layers 142 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the first sacrificial material layers 142 can be spacer material layers that comprise silicon nitride or a semiconductor material including at least one of silicon and germanium.

In one embodiment, the first insulating layers 132 can include silicon oxide, and the sacrificial material layers 142 can include silicon nitride. The first insulating layers 132 can be deposited, for example, by chemical vapor deposition (CVD). For example, if silicon oxide is employed for the first insulating layers 132, tetraethyl orthosilicate (TEOS) can be employed as the precursor material for the CVD process. The first sacrificial material layers 142 can be formed, for example, CVD or atomic layer deposition (ALD).

The thicknesses of the first insulating layers 132 and the first sacrificial material layers 142 can be in a range from 20 nm to 50 nm, although lesser and greater thicknesses can be employed for each first insulating layer 132 and for each first sacrificial material layer 142. The number of repetitions of the pairs of a first insulating layer 132 and a first sacrificial material layer 142 can be in a range from 2 to 1,024, and typically from 8 to 256, although a greater number of repetitions can also be employed. In one embodiment, each first sacrificial material layer 142 in the first alternating stack (132, 142) can have a uniform thickness that is substantially invariant within each respective first sacrificial material layer 142.

While the present disclosure is described employing an embodiment in which the first spacer material layers are first sacrificial material layers 142 that are subsequently replaced with electrically conductive layers, embodiments are expressly contemplated herein in which the first spacer material layers are formed as electrically conductive layers. In this case, steps for replacing the first spacer material layers with first electrically conductive layers can be omitted.

First stepped surfaces are formed at a peripheral region of the first alternating stack (132, 142), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the first alternating stack (132, 142) are removed through formation of the first stepped surfaces. A "stepped cavity" refers to a cavity having stepped surfaces.

The first stepped surfaces formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each first sacrificial material layer 142 other than a topmost first sacrificial material layer 142 within the first alternating stack (132, 142) laterally extends farther than any overlying first sacrificial material layer 142 within the first alternating stack (132, 142) in the terrace region. The terrace region includes stepped surfaces of the first alternating stack (132, 142) that continuously extend from a bottommost layer within the first alternating stack (132, 142) to a topmost layer within the first alternating stack (132, 142).

Each vertical step of the stepped surfaces can have the height of one or more pairs of a first insulating layer 132 and a first sacrificial material layer. In one embodiment, each vertical step can have the height of a single pair of a first insulating layer 132 and a first sacrificial material layer 142. In another embodiment, multiple "columns" of staircases can be formed along a first horizontal direction hd1 such that each vertical step has the height of a plurality of pairs of a first insulating layer 132 and a first sacrificial material layer 142, and the number of columns can be at least the number of the plurality of pairs. Each column of staircase can be vertically offset among one another such that each of the first sacrificial material layers 142 has a physically exposed top surface in a respective column of staircases. In the illustrative example, two columns of staircases are formed for each block of memory stack structures to be subsequently formed such that one column of staircases provide physically exposed top surfaces for odd-numbered first sacrificial material layers 142 (as counted from the bottom) and another column of staircases provide physically exposed top surfaces for even-numbered first sacrificial material layers (as counted from the bottom). Configurations employing three, four, or more columns of staircases with a respective set of vertical offsets among the physically exposed surfaces of the first sacrificial material layers 142 may also be employed. Each first sacrificial material layer 142 has a greater lateral extent, at least along one direction, than any overlying first sacrificial material layers 142 such that each physically exposed surface of any first sacrificial material layer 142 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A first retro-stepped dielectric material portion 165 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost first insulating layer 132, for example, by chemical mechanical planarization (CMP). The remaining portion of the deposited dielectric material filling the stepped cavity constitutes the first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. If silicon oxide is employed for the first retro-stepped dielectric material portion 165, the silicon oxide of the first retro-stepped dielectric material portion 165 may, or may not, be doped with dopants such as B, P, and/or F.

Figure 3B:
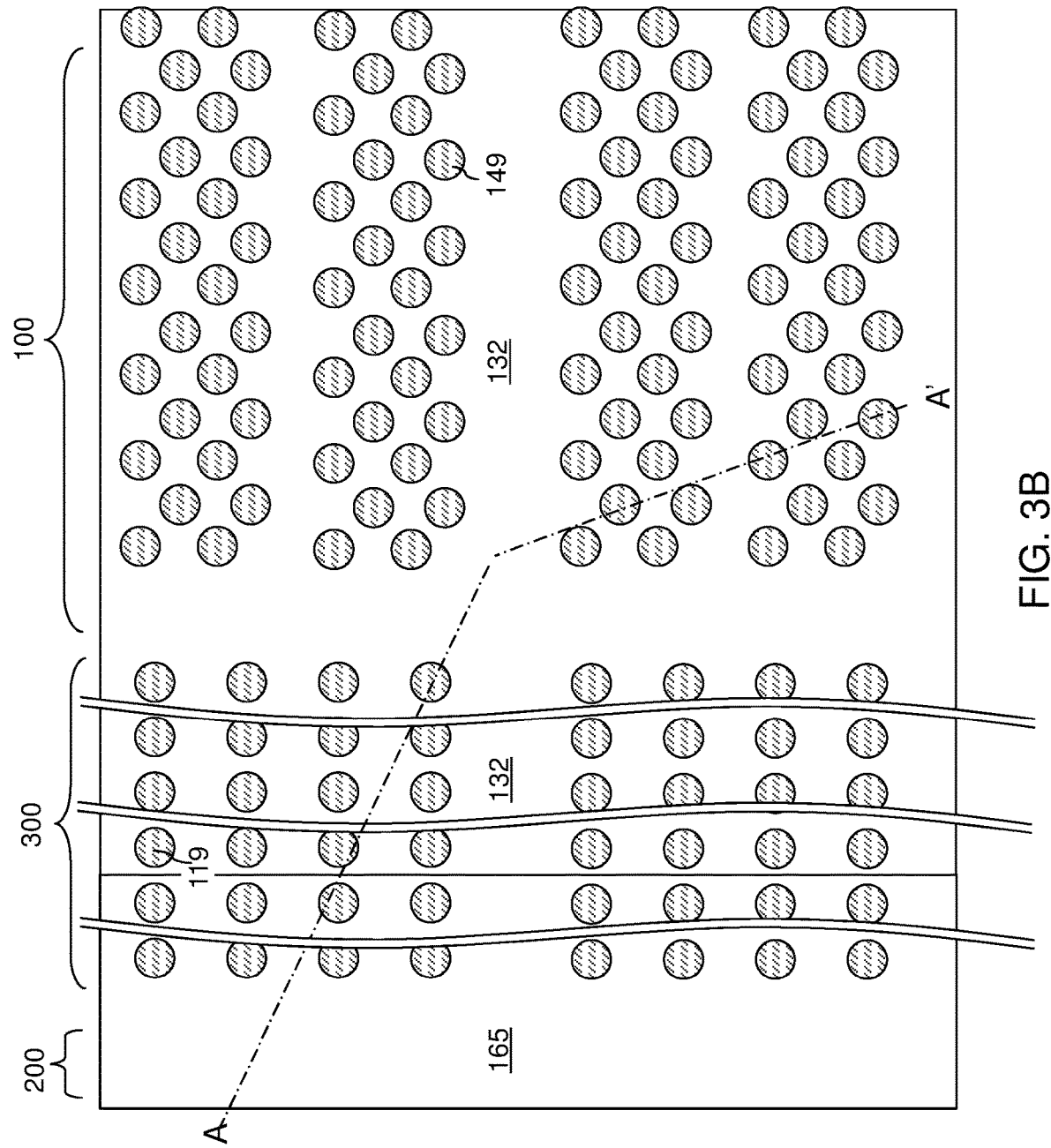
FIG. 3B is a top-down view of the exemplary structure of FIG. 3A. The vertical plane A-A' is the plane of the cross-section for FIG. 3A.

Referring to FIGS. 3A and 3B, a lithographic material stack (not shown) including at least a photoresist layer can be formed over the first alternating stack (132, 142) and the first retro-stepped dielectric material portion 165, and can be lithographically patterned to form openings therein. The openings include a first set of openings formed over the memory array region 100 and a second set of openings formed over the staircase region 300. The pattern in the lithographic material stack can be transferred through the first alternating stack (132, 142) and/or the first retro-stepped dielectric material portion 165 by at least one anisotropic etch that employs the patterned lithographic material stack as an etch mask. Portions of the first alternating stack (132, 142) underlying the openings in the patterned lithographic material stack are etched to form first memory openings 149 and first support openings 119. As used herein, a "first memory opening" refers to a structure in which memory elements, such as a memory stack structure, is subsequently formed. As used herein, a "first support opening" refers to a structure in which a support structure (such as a support pillar structure) that mechanically supports other elements is subsequently formed. The first memory openings 149 are formed through the first alternating stack (132, 142) in the memory array region 100. The first support openings 119 are formed through the first retro-stepped dielectric material portion 165 and the portion of the first alternating stack (132, 142) that underlie the stepped surfaces in the staircase region 300.

The first memory openings 149 extend through the entirety of the first alternating stack (132, 142). The first support openings 119 extend through a subset of layers within the first alternating stack (132, 142). The chemistry of the anisotropic etch process employed to etch through the materials of the first alternating stack (132, 142) can alternate to optimize etching of the first and second materials in the first alternating stack (132, 142). The anisotropic etch can be, for example, a series of reactive ion etches. The sidewalls of the first memory openings 149 and the first support openings 119 can be substantially vertical, or can be tapered. The patterned lithographic material stack can be subsequently removed, for example, by ashing.

The first memory openings 149 and the first support openings 119 can extend from the top surface of the first alternating stack (132, 142) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each first memory opening 149 and each first support opening 119. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the first memory openings 149 and the first support openings 119 can be coplanar with the topmost surface of the semiconductor material layer 10.

Each of the first memory openings 149 and the first support openings 119 may include a sidewall (or a plurality of sidewalls) that extends substantially perpendicular to the topmost surface of the substrate. A two-dimensional array of first memory openings 149 can be formed in the memory array region 100. A two-dimensional array of first support openings 119 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the first memory openings 149 and the first support openings 119 can be extend to a top surface of the substrate semiconductor layer 9.

FIGS. 4A-4E are sequential schematic vertical cross-sectional views of a first memory opening 149 during formation of a first in-process memory opening fill structure according to an embodiment of the present disclosure.

Referring to FIG. 4A, a first memory opening 149 in the exemplary device structure of FIGS. 3A and 3B is illustrated. The first memory opening 149 extends through the first alternating stack (132, 142) and optionally into an upper portion of the semiconductor material layer 10. At this processing step, each first support opening 119 can extend through the first retro-stepped dielectric material portion 165, a subset of layers in the first alternating stack (132, 142), and optionally through the upper portion of the semiconductor material layer 10. The recess depth of the bottom surface of each first memory opening with respect to the top surface of the semiconductor material layer 10 can be in a range from 0 nm to 30 nm, although greater recess depths can also be employed. Optionally, the first sacrificial material layers 142 can be laterally recessed partially to form lateral recesses (not shown), for example, by an isotropic etch.

An optional pedestal channel portion (e.g., an epitaxial pedestal) 11 can be formed at the bottom portion of each first memory opening 149 and each first support openings 119, for example, by selective epitaxy. Generally, the pedestal channel portions 11 include a semiconductor material having a doping of the first conductivity type. In case the semiconductor material layer 10 includes a single crystalline semiconductor material, each pedestal channel portion 11 can comprise a single crystalline semiconductor material, such as single crystal silicon, in epitaxial alignment with the single crystalline semiconductor material of the semiconductor material layer 10. In one embodiment, the top surface of each pedestal channel portion 11 can be formed above a horizontal plane including the top surface of a bottommost first sacrificial material layer 142. In this case, a source select gate electrode can be subsequently formed by replacing the bottommost first sacrificial material layer 142 with a conductive material layer. The pedestal channel portion 11 can be a portion of a transistor channel that extends between a source region to be subsequently formed in the substrate (9, 10) and a drain region to be subsequently formed in an upper portion of the first memory opening 149. A memory cavity 149' is present in the unfilled portion of the first memory opening 149 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 4B, a first memory film layer 150L can be deposited on the top surface of each pedestal channel portion 11, sidewalls of the first memory openings 149 and sidewalls of the first support openings, and top surfaces of the topmost first insulating layer 132 and the first retro-stepped dielectric material portion 165. The first memory film layer 150L includes a stack of layers containing a first blocking dielectric layer 152, a first charge storage layer 154, and a first tunneling dielectric layer 156 can be sequentially deposited in the first memory openings 149.

The first blocking dielectric layer 152 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 152 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the first blocking dielectric layer 152 includes aluminum oxide. In one embodiment, the first blocking dielectric layer 152 can include multiple dielectric metal oxide layers having different material compositions.

Alternatively or additionally, the first blocking dielectric layer 152 can include a dielectric semiconductor compound such as silicon oxide, silicon oxynitride, silicon nitride, or a combination thereof. In one embodiment, the first blocking dielectric layer 152 can include silicon oxide. In this case, the dielectric semiconductor compound of the first blocking dielectric layer 152 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the first blocking dielectric layer 152 can be omitted, and a backside blocking dielectric layer can be formed after formation of backside recesses on surfaces of memory films to be subsequently formed.

Subsequently, the first charge storage layer 154 can be formed. In one embodiment, the first charge storage layer 154 can be a continuous layer or patterned discrete portions of a charge trapping material including a dielectric charge trapping material, which can be, for example, silicon nitride. Alternatively, the first charge storage layer 154 can include a continuous layer or patterned discrete portions of a conductive material such as doped polysilicon or a metallic material that is patterned into multiple electrically isolated portions (e.g., floating gates), for example, by being formed within lateral recesses into the first sacrificial material layers 142. In one embodiment, the first charge storage layer 154 includes a silicon nitride layer. In one embodiment, the first sacrificial material layers 142 and the first insulating layers 132 can have vertically coincident sidewalls, and the first charge storage layer 154 can be formed as a single continuous layer.

In another embodiment, the first sacrificial material layers 142 can be laterally recessed with respect to the sidewalls of the first insulating layers 132, and a combination of a deposition process and an anisotropic etch process can be employed to form the first charge storage layer 154 as a plurality of memory material portions that are vertically spaced apart. While the present disclosure is described employing an embodiment in which the first charge storage layer 154 is a single continuous layer, embodiments are expressly contemplated herein in which the first charge storage layer 154 is replaced with a plurality of memory material portions (which can be charge trapping material portions or electrically isolated conductive material portions) that are vertically spaced apart.

The first charge storage layer 154 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the first charge storage layer 154 may comprise an insulating charge trapping material, such as one or more silicon nitride segments. Alternatively, the first charge storage layer 154 may comprise conductive nanoparticles such as metal nanoparticles, which can be, for example, ruthenium nanoparticles. The first charge storage layer 154 can be formed, for example, by chemical vapor deposition (CVD), atomic layer deposition (ALD), physical vapor deposition (PVD), or any suitable deposition technique for storing electrical charges therein. The thickness of the first charge storage layer 154 can be in a range from 2 nm to 20 nm, although lesser and greater thicknesses can also be employed.

The first tunneling dielectric layer 156 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The first tunneling dielectric layer 156 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the first tunneling dielectric layer 156 can include a stack of a first silicon oxide layer, a silicon oxynitride layer, and a second silicon oxide layer, which is commonly known as an ONO stack. In one embodiment, the first tunneling dielectric layer 156 can include a silicon oxide layer that is substantially free of carbon or a silicon oxynitride layer that is substantially free of carbon. The thickness of the first tunneling dielectric layer 156 can be in a range from 2 nm to 20 nm, although lesser and greater thicknesses can also be employed.

Referring to FIG. 4C, an optional first patterning film 147 can be anisotropically deposited. The first patterning film 147 includes a carbon-based material that can be subsequently employed as an etch mask material. In one embodiment, the first patterning film 147 can include amorphous carbon and/or diamond-like carbon (DLC). For example, the first patterning film 147 can include Advanced Patterning Film™ available from Applied Materials, Inc.® The first patterning film 147 can be deposited by an anisotropic deposition process such that the thickness of the first patterning film 147 in the memory openings 149 and in the support openings 119 decreases with a vertical distance from the topmost horizontal surface of the first memory film layer 150L that overlies the first alternating stack (132, 142). Thus, the thickness of the first memory film layer 150L at the bottom of the first memory openings 149 and the first support openings 119 is less than the thickness of the first memory film layer 150L that overlies the topmost surface of the first memory film layer 150L.

An anisotropic etch process can be performed to etch the horizontal portions of the first memory film layer 150L at the bottom of each first memory openings 149 and at the bottom of each first support openings 119. Vertical portions of the first patterning film 147 and a thick horizontal portion of the first patterning film 147 that overlie the topmost surface of the first memory film layer 150L protect underlying portions of the first memory film layer 150L, while bottommost portions of the first memory film layer 150L contacting the pedestal channel portions 11 are etched through. Openings are formed at the bottommost portions of the first memory film layer 150L that overlie a respective one of the pedestal channel portions 11. Due to a finite thickness of remaining vertical portions of the first patterning film 147 on inner sidewalls of the first memory film layer 150L, the first memory film layer 150L can include horizontal annular portions 150A that laterally protrude inward from a bottom end of each cylindrical portion of the first memory film layer 150L. The first patterning film 147 can be removed, for example, by ashing.

Referring to FIG. 4D, a sacrificial protective layer 120L can be deposited in the first memory openings 149, in the first support openings 119, and over the first alternating stack (132, 142). The sacrificial protective layer may be any suitable conductive, dielectric (i.e., insulating) or semiconductor material which can be etched selectively with respect to the inner portion of the tunneling dielectric layer 156 (i.e., the portion that contacts the semiconductor channel), and which can act as an etch stop during selective etching of an opening fill material portion, as will be described in more detail below. In one embodiment, the sacrificial protective layer may comprise a continuous sacrificial dielectric material layer 120L. Specifically, the continuous sacrificial dielectric material 120L can be deposited directly on the physically exposed portions of the top surfaces of the pedestal channel portions 11 and on the physically exposed surfaces of the first memory film layer 150L (e.g., on the inner surfaces of the tunneling dielectric layer 156).

Figure 5B:
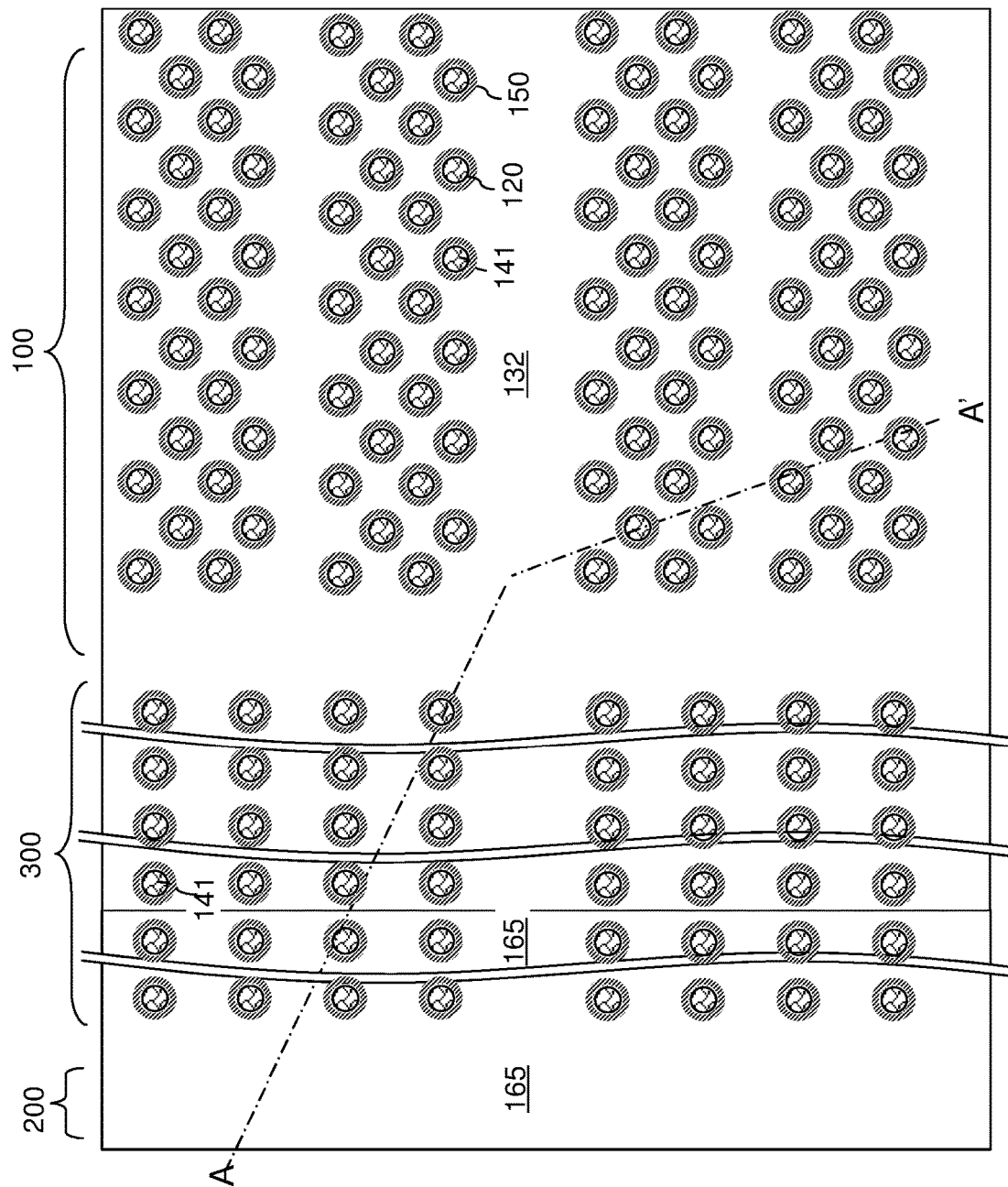
FIG. 5B is a top-down view of the exemplary structure of FIG. 5A. The vertical plane A-A' is the plane of the cross-section for FIG. 5A.

The continuous sacrificial dielectric material layer 120L includes a dielectric material that has a higher etch rate (e.g., at least 100 times, such as at least 500 times, for example 1,000 to 16,000 times) in hydrofluoric acid vapor ("HF vapor") than the inner surface of the tunneling dielectric which will be formed subsequently. Optionally, the continuous sacrificial dielectric material layer 120L includes a dielectric material that also has a higher etch rate (e.g., at least 100 times, such as at least 500 times, for example 1,000 to 16,000 times) in hydrofluoric acid vapor ("HF vapor") than the first insulating layers 132. In one embodiment, the inner surface (e.g., inner layer) of the tunneling dielectric and optionally first insulating layers 132 include undoped silicate glass (e.g., silicon dioxide) formed by thermal decomposition of tetraethylorthosilicate (TEOS) and free of dopant atoms, such as boron, above an unavoidable impurity level. The continuous sacrificial dielectric material layer 120L can include a doped silicate glass material having a higher etch rate in HF vapor than silicon dioxide. In one embodiment, the continuous sacrificial dielectric material layer 120L can include borosilicate glass ("BSG") including boron atoms at an atomic concentration of at least $1 \times 10^{21}$ $cm^{-3}$, such as $1 \times 10^{21}$ $cm^{-3}$ to $1 \times 10^{22}$ $cm^{-3}$, including such as $5 \times 10^{21}$ $cm^{-3}$ to $6 \times 10^{21}$ $cm^{-3}$. The continuous sacrificial dielectric material layer 120L may be deposited using the thermal CVD using TEOS and trimethyl boron source vapors at a temperature between 650 and 750° C., such as 685 to 700° C. The continuous sacrificial dielectric material layer 120L can directly contact a center portion of the top surface of each pedestal channel portion 11. The thickness of the continuous sacrificial dielectric material layer 120L can be in a range from 2 nm to 40 nm, such as from 4 nm to 20 nm, although lesser and greater thicknesses can also be employed. In case the tunneling dielectric layer 156 includes an ONO stack (i.e., a layer stack of an outer thermal silicon oxide layer, a thermal silicon nitride layer, and an inner thermal silicon oxide layer), the continuous sacrificial dielectric material layer 120L can be removed selective to the ONO stack with a selectivity of 100 or greater (such as 500 or greater, for example 1,000 to 16,000) using HF vapor. Referring to FIGS. 4E, 5A, and 5B, a first-tier opening fill material can be deposited in remaining volumes of the first memory openings 149 and the first support openings 119. The first-tier opening fill material includes a material that can be removed selective to the material of the sacrificial dielectric material layer 120L. For example, the first-tier opening fill material can include amorphous silicon, polysilicon, or a silicon-germanium alloy. As will be described in more detail below with respect to FIGS. 12A and 12B, portions of the BSG continuous sacrificial dielectric material layer 120L can be used to protect the silicon pedestal channel portions 11 during removal of sacrificial silicon first-tier opening fill material. Then, as will be described below, the portions of the BSG continuous sacrificial dielectric material layer 120L may be selectively removed by a HF vapor etch (also referred to as a vapor phase cleaning "VPC" process). Since the VPC process does not substantially etch the silicon pedestal channel portions 11 during the removal of the BSG material, the silicon pedestal channel portions 11 are not damaged during the selective etching of the BSG material by the VPC process.

Portions of the first-tier opening fill material, the continuous sacrificial dielectric material layer 120L, and the first memory film layer 150L that overlie the horizontal plane including the top surface of the topmost first insulating layer 132 can be removed by a planarization process. The planarization process can employ chemical mechanical planarization and/or at least one recess etch process. Remaining portions of the first-tier opening fill material, the continuous sacrificial dielectric material layer 120L, and the first memory film layer 150L can have top surfaces that are substantially coplanar with the horizontal plane including the top surface of the topmost first insulating layer 132. Each remaining portion of the first-tier opening fill material constitutes a first-tier opening fill material portion 141. Each remaining portion of the continuous sacrificial dielectric material layer 120L constitutes a sacrificial dielectric liner 120. Each remaining portion of the first memory film layer 150L constitutes a first memory film 150. Each first memory film 150 includes a layer stack of a first blocking dielectric layer 152, a first charge storage layer 154, and a first tunneling dielectric layer 156.

Each first memory opening 149 and each first support opening 119 are filled with a respective combination (11, 120, 150, 141) of material portions. Each combination (11, 120, 150, 141) comprises a pedestal channel portion 11 contacting a top surface of the semiconductor material layer 10 and a bottom portion of a sidewall of a respective one of the first memory openings 149 and the first support openings 119. Each combination (11, 120, 150, 141) comprises a sacrificial liner 120 (such as a sacrificial dielectric liner 120), a first memory film 150, and a first-tier opening fill material portion 141. Each of the first memory films 150 is formed on, and contacts, a peripheral portion of a top surface of a respective pedestal channel portion 11. Alternatively, the sacrificial liner 120 may comprise a sacrificial conductive or semiconductor liner.

Each combination (11, 120, 150, 141) of material portions filling a first memory opening 149 constitutes a first in-process memory opening fill structure. Each combination (11, 120, 150, 141) of material portions filling a first support opening 119 constitutes a first in-process support opening fill structure.

Figure 6:
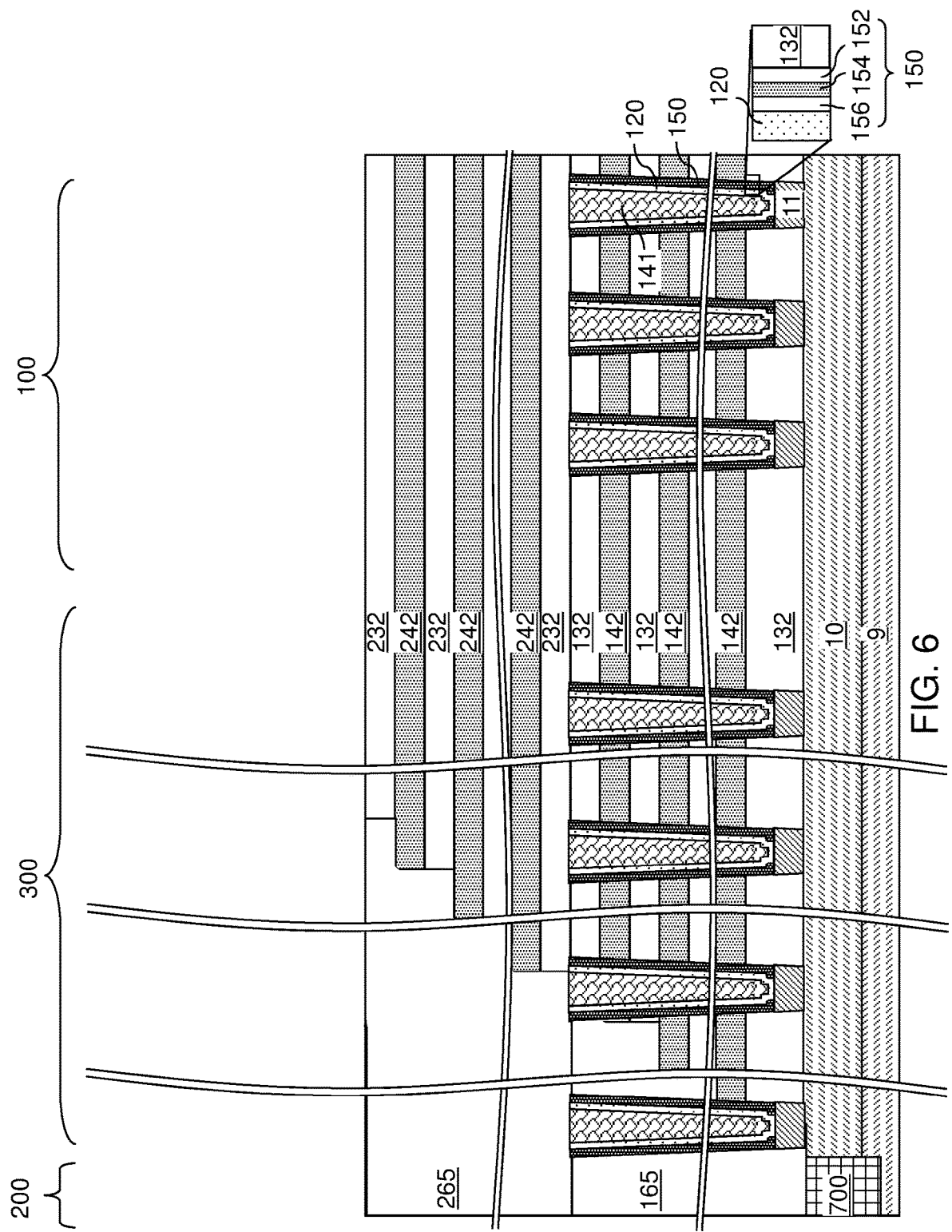
FIG. 6 is a schematic vertical cross-sectional view of the exemplary structure after formation of a second alternating stack of second insulating layers and second spacer material layers, second stepped surfaces, and a second retro-stepped dielectric material portion according to an embodiment of the present disclosure.

Referring to FIG. 6, a second alternating stack (232, 242) of second insulating layers 232 and second spacer material layers can be formed. The second spacer material layers can include second electrically conductive layers or second sacrificial material layers 242 that are subsequently replaced with second electrically conductive layers. The second insulating layers 232 can have the same material composition and the same thickness as the first insulating layers 132. The second sacrificial material layers 242 can have the same material composition and the same thickness as the first sacrificial material layers 142.

While the present disclosure is described employing an embodiment in which the second spacer material layers are second sacrificial material layers 242 that are subsequently replaced with electrically conductive layers, embodiments are expressly contemplated herein in which the second spacer material layers are formed as electrically conductive layers. In this case, steps for replacing the second spacer material layers with second electrically conductive layers can be omitted.

Second stepped surfaces are formed in the staircase region 300 by patterning the second alternating stack (232, 242). The second stepped surfaces can be more proximal to the memory array region 100 than the first stepped surfaces are to the memory array region 100. A stepped cavity is formed within the volume from which portions of the second alternating stack (232, 242) are removed through formation of the second stepped surfaces. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps.

Each second sacrificial material layer 242 other than a topmost second sacrificial material layer 242 within the second alternating stack (232, 242) laterally extends farther than any overlying second sacrificial material layer 242 within the second alternating stack (232, 242) in the terrace region. The terrace region includes stepped surfaces of the second alternating stack (232, 242) that continuously extend from a bottommost layer within the second alternating stack (232, 242) to a topmost layer within the second alternating stack (232, 242). Each vertical step of the stepped surfaces can have the height of one or more pairs of a second insulating layer 232 and a second sacrificial material layer. In one embodiment, each vertical step can have the height of a single pair of a second insulating layer 232 and a second sacrificial material layer 242. In another embodiment, multiple columns of staircases can be formed along a second horizontal direction hd1 such that each vertical step has the height of a plurality of pairs of a second insulating layer 232 and a second sacrificial material layer 242, and the number of columns can be at least the number of the plurality of pairs.

A second retro-stepped dielectric material portion 265 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost second insulating layer 232, for example, by chemical mechanical planarization (CMP). The remaining portion of the deposited dielectric material filling the stepped cavity constitutes the second retro-stepped dielectric material portion 265. If silicon oxide is employed for the second retro-stepped dielectric material portion 265, the silicon oxide of the second retro-stepped dielectric material portion 265 may, or may not, be doped with dopants such as B, P, and/or F.

Referring to FIG. 7A, a lithographic material stack (not shown) including at least a photoresist layer can be formed over the second alternating stack (232, 242) and the second retro-stepped dielectric material portion 265, and can be lithographically patterned to form openings therein. The openings include a first set of openings formed over the first in-process memory opening fill structures and a second set of openings formed over the first in-process support opening fill structures. The pattern in the lithographic material stack can be transferred through the second alternating stack (232, 242) and/or the second retro-stepped dielectric material portion 265 by at least one anisotropic etch that employs the patterned lithographic material stack as an etch mask. Portions of the second alternating stack (232, 242) underlying the openings in the patterned lithographic material stack are etched to form second memory openings 249 and second support openings. The second memory openings 249 extend through the entirety of the second alternating stack (232, 242). The second support openings extend through a subset of layers within the second alternating stack (232, 242). The patterned lithographic material stack can be subsequently removed, for example, by ashing. A two-dimensional array of second memory openings 249 can be formed in the memory array region 100. A two-dimensional array of second support openings can be formed in the staircase region 300.

Referring to FIG. 7B, a second memory film layer 250L can be deposited on the top surface of each of the first in-process memory opening fill structures and the first in-process support opening fill structures, sidewalls of the second memory openings 249 and sidewalls of the second support openings, and top surfaces of the topmost second insulating layer 232 and the second retro-stepped dielectric material portion 265. The second memory film layer 250L includes a stack of layers containing a second blocking dielectric layer 252, a second charge storage layer 254, and a second tunneling dielectric layer 256 can be sequentially deposited in the second memory openings 249.

The second blocking dielectric layer 252 can have the same material composition and the same thickness as the first blocking dielectric layer 152. The second charge storage layer 254 can have the same material composition and the same thickness as the first charge storage layer 154. The second tunneling dielectric layer 256 can have the same material composition and the same thickness as the first tunneling dielectric layer 156.

A second patterning film 247 can be anisotropically deposited over the second memory film layer 250L. The second patterning film 247 includes a carbon-based material that can be subsequently employed as an etch mask material. In one embodiment, the second patterning film 247 can include amorphous carbon and/or diamond-like carbon (DLC). The second patterning film 247 can be deposited by an anisotropic deposition process such that the thickness of the second patterning film 247 in the memory openings 249 and in the support openings decreases with a vertical distance from the topmost horizontal surface of the second memory film layer 250L that overlies the second alternating stack (232, 242). Thus, the thickness of the second memory film layer 250L at the bottom of the second memory openings 249 and the second support openings is less than the thickness of the second memory film layer 250L that overlies the topmost surface of the second memory film layer 250L.

An anisotropic etch process can be performed to etch the horizontal portions of the second memory film layer 250L at the bottom of each second memory openings 249 and at the bottom of each second support openings. Vertical portions of the second patterning film 247 and a thick horizontal portion of the second patterning film 247 that overlie the topmost surface of the second memory film layer 250L protect underlying portions of the second memory film layer 250L, while bottommost portions of the second memory film layer 250L are etched through. Openings are formed at the bottommost portions of the second memory film layer 250L that overlie a respective one of the first in-process memory opening fill structures and the first in-process support opening fill structures. Due to a finite thickness of remaining vertical portions of the second patterning film 247 on inner sidewalls of the second memory film layer 250L, the second memory film layer 250L can include horizontal annular portions 250A that laterally protrude inward from a bottom end of each cylindrical portion of the second memory film layer 250L. The second patterning film 247 can be removed, for example, by ashing. The inner tip of the horizontal annular portion 250A does not contact the first memory film 150.

Figure 8A:
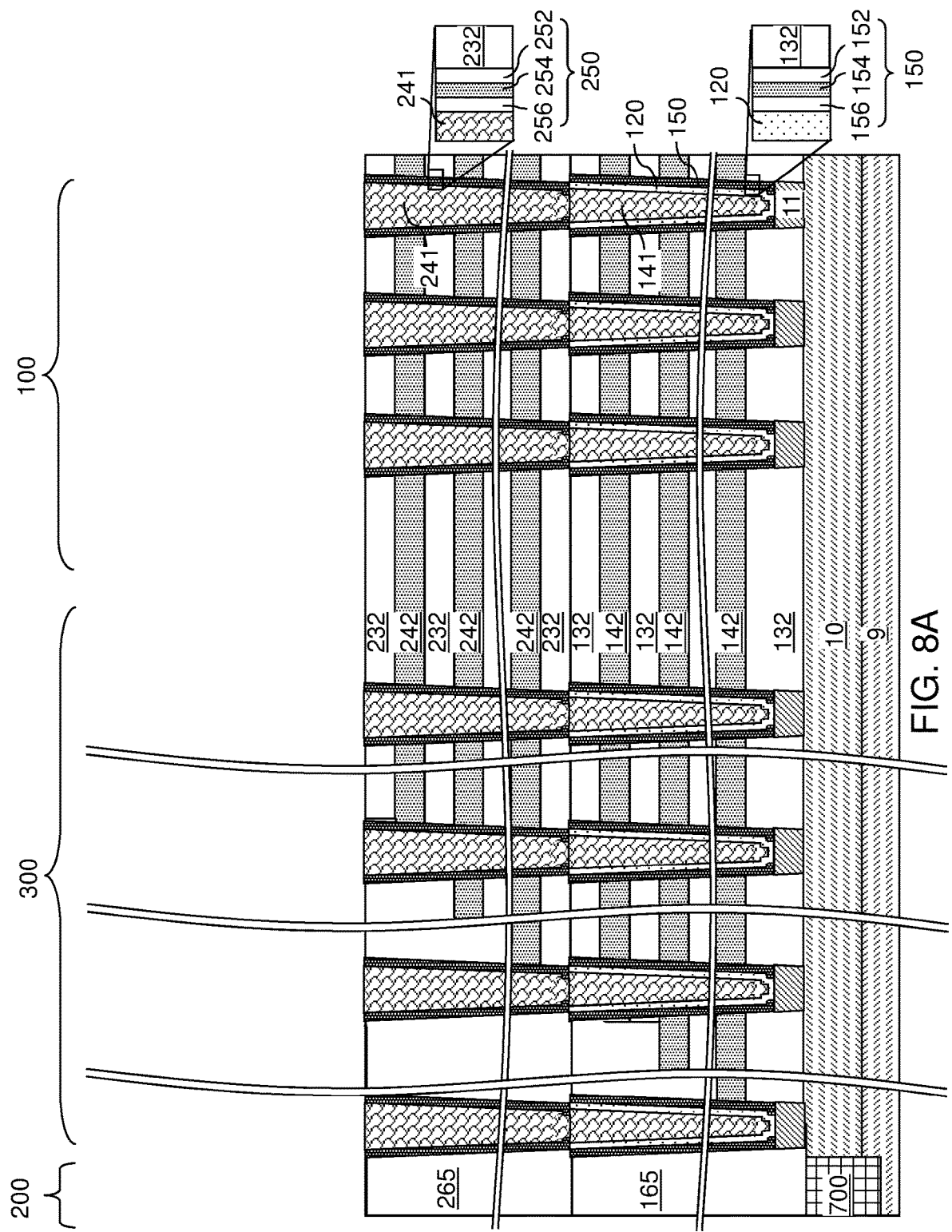
FIG. 8A is a schematic vertical cross-sectional view of the exemplary structure after formation of second in-process memory opening fill structures according to an embodiment of the present disclosure.
Figure 8B:
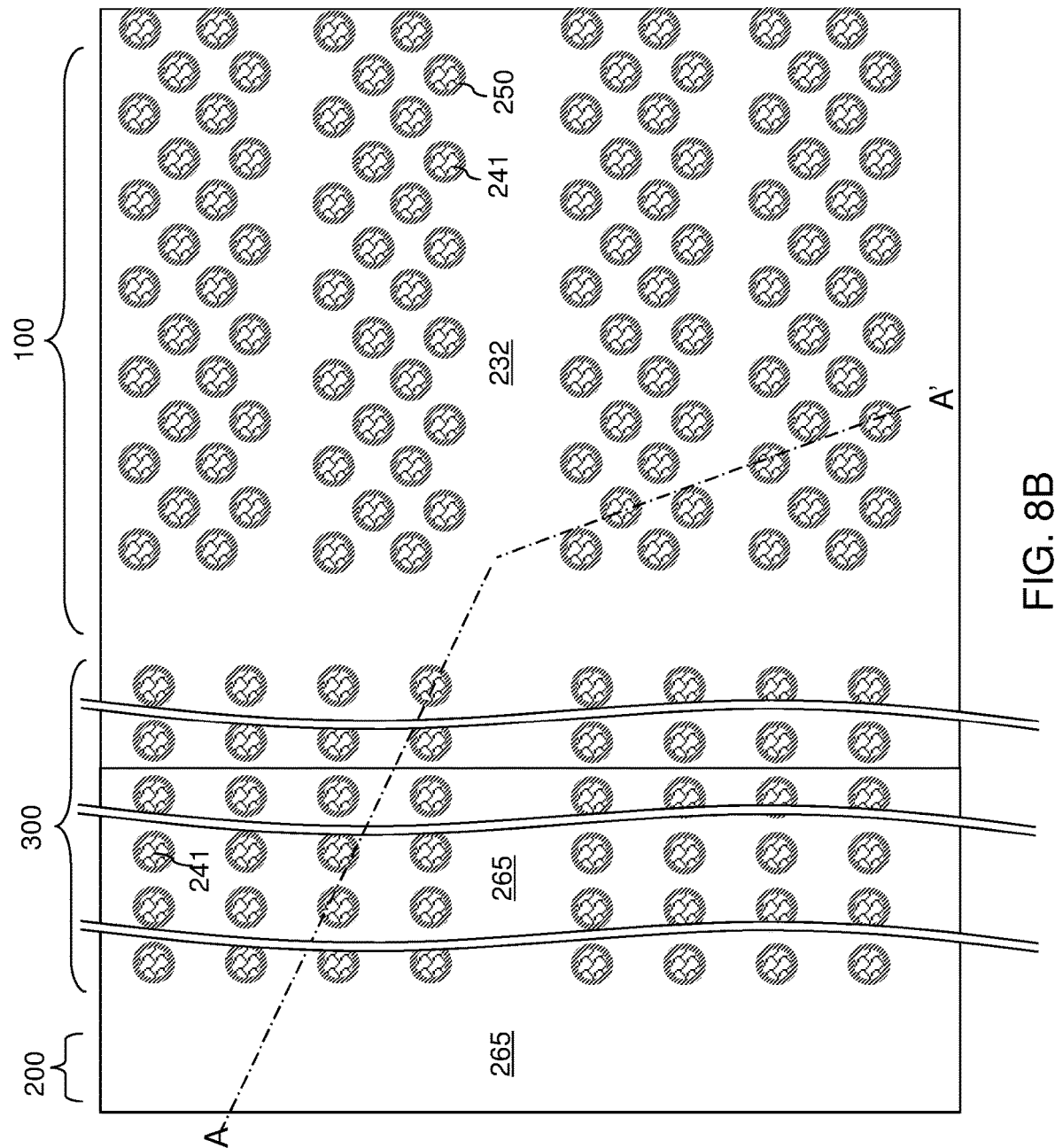
FIG. 8B is a top-down view of the exemplary structure of FIG. 8A. The vertical plane A-A' is the plane of the cross-section for FIG. 8A.

Referring to FIGS. 7C, 8A, and 8B, a second-tier opening fill material can be deposited in remaining volumes of the second memory openings 249 and the second support openings. The second-tier opening fill material can include the same material as the first-tier opening fill material portions 141. For example, the second-tier opening fill material can include amorphous silicon, polysilicon, or a silicon-germanium alloy.

Portions of the second-tier opening fill material and the second memory film layer 250L that overlie the horizontal plane including the top surface of the topmost second insulating layer 232 can be removed by a planarization process. The planarization process can employ chemical mechanical planarization and/or at least one recess etch process. Remaining portions of the second-tier opening fill material and the second memory film layer 250L can have top surfaces that are substantially coplanar with the horizontal plane including the top surface of the topmost second insulating layer 232. Each remaining portion of the second-tier opening fill material constitutes a second-tier opening fill material portion 241. Each remaining portion of the second memory film layer 250L constitutes a second memory film 250. Each second memory film 250 includes a layer stack of a second blocking dielectric layer 252, a second charge storage layer 254, and a second tunneling dielectric layer 256. Preferably, the sacrificial liner 120, such as the sacrificial dielectric liner 120, is omitted in the second tier between the second memory film 250 and second-tier opening fill material portions 241.

Each second memory opening 249 and each second support opening are filled with a respective combination (250, 241) of material portions. Each combination (250, 241) comprises a second memory film 250 and a second-tier opening fill material portion 241. Each combination (250, 241) of material portions filling a second memory opening 249 constitutes a second in-process memory opening fill structure. Each combination (250, 241) of material portions filling a second support opening constitutes a second in-process support opening fill structure.

Figure 9:
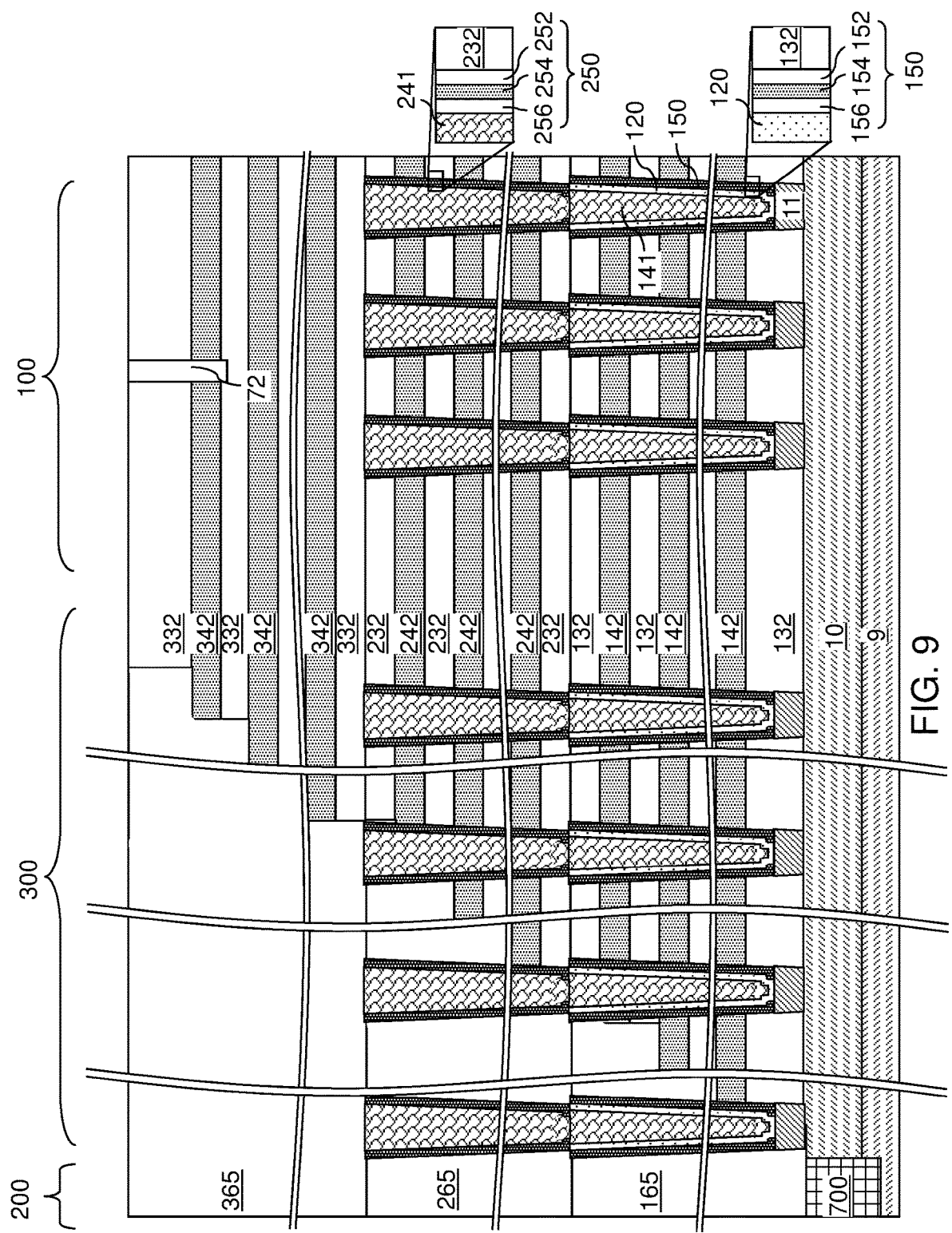
FIG. 9 is a schematic vertical cross-sectional view of the exemplary structure after formation of a third alternating stack of third insulating layers and third spacer material layers, third stepped surfaces, and a third retro-stepped dielectric material portion according to an embodiment of the present disclosure.

Referring to FIG. 9, the processing steps of FIGS. 6, 7A-7C, 8A, and 8B may be optionally repeated once or multiple times to form at least one additional alternating stack of additional insulating layers and additional sacrificial material layers, additional in-process memory opening fill structures, and additional in-process support opening fill structure. A topmost alternating stack can be subsequently formed over the topmost one of the at least one additional alternating stack, or over the second alternating stack (232, 242) in case the additional alternating stacks are not employed. Alternatively, the topmost alternating stack may be formed directly on the first alternating stack (132, 142) in case the second alternating stack (232, 242) is not formed. In case an additional alternating stack of additional insulating layers and additional sacrificial material layers is not formed, a third alternating stack (332, 342) of third insulating layers 332 and third spacer material layers can be formed over the second alternating stack (232, 242). While the present invention is described employing an embodiment in which a third alternating stack (332, 342) is formed as a topmost alternating stack over the second alternating stack (232, 242), embodiments are expressly contemplated herein in which 2, 4, 5, 6, or more alternating stacks are employed.

The third spacer material layers can include third electrically conductive layers or third sacrificial material layers 342 that are subsequently replaced with third electrically conductive layers. The third insulating layers 332 can have the same material composition and the same thickness as the first insulating layers 132. The third sacrificial material layers 342 can have the same material composition and the same thickness as the first sacrificial material layers 142. While the present disclosure is described employing an embodiment in which the third spacer material layers are third sacrificial material layers 342 that are subsequently replaced with electrically conductive layers, embodiments are expressly contemplated herein in which the third spacer material layers are formed as electrically conductive layers. In this case, steps for replacing the third spacer material layers with third electrically conductive layers can be omitted. Optionally, drain-select-level isolation structures 72 can be formed through at least one of the third sacrificial material layers 342.

Third stepped surfaces are formed in the staircase region 300 by patterning the third alternating stack (332, 342). The third stepped surfaces can be more proximal to the memory array region 100 than the second stepped surfaces are to the memory array region 100. A stepped cavity is formed within the volume from which portions of the third alternating stack (332, 342) are removed through formation of the stepped surfaces. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps.

Each third sacrificial material layer 342 other than a topmost third sacrificial material layer 342 within the third alternating stack (332, 342) laterally extends farther than any overlying third sacrificial material layer 342 within the third alternating stack (332, 342) in the terrace region. The terrace region includes stepped surfaces of the third alternating stack (332, 342) that continuously extend from a bottommost layer within the third alternating stack (332, 342) to a topmost layer within the third alternating stack (332, 342). Each vertical step of the stepped surfaces can have the height of one or more pairs of a third insulating layer 332 and a third sacrificial material layer. In one embodiment, each vertical step can have the height of a single pair of a third insulating layer 332 and a third sacrificial material layer 342. In another embodiment, multiple columns of staircases can be formed along a third horizontal direction hd1 such that each vertical step has the height of a plurality of pairs of a third insulating layer 332 and a third sacrificial material layer 342, and the number of columns can be at least the number of the plurality of pairs.

A third retro-stepped dielectric material portion 365 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost third insulating layer 332, for example, by chemical mechanical planarization (CMP). The remaining portion of the deposited dielectric material filling the stepped cavity constitutes the third retro-stepped dielectric material portion 365. If silicon oxide is employed for the third retro-stepped dielectric material portion 365, the silicon oxide of the third retro-stepped dielectric material portion 365 may, or may not, be doped with dopants such as B, P, and/or F.

Figure 10A:
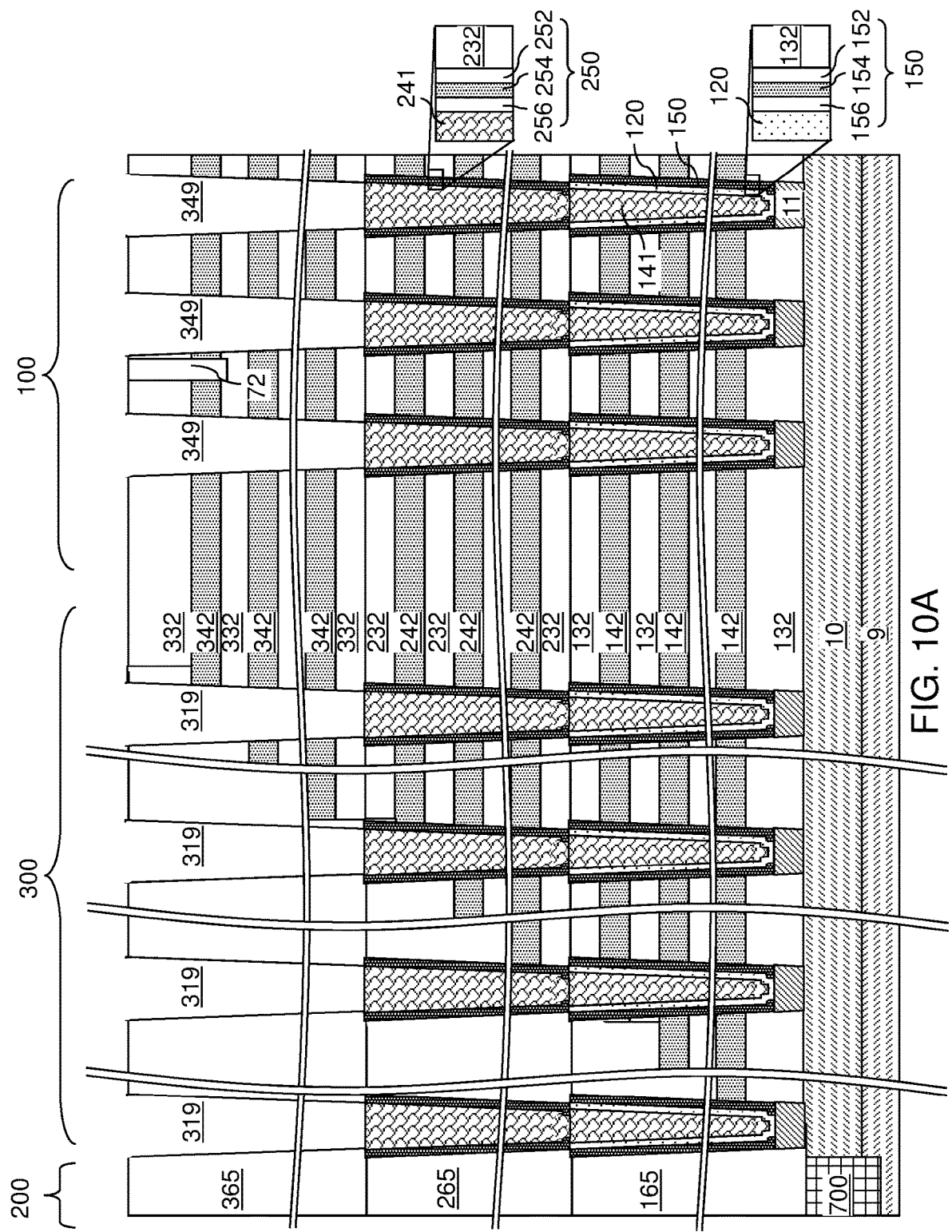
FIG. 10A is a schematic vertical cross-sectional view of the exemplary structure after formation of third memory openings according to an embodiment of the present disclosure.
Figure 10B:
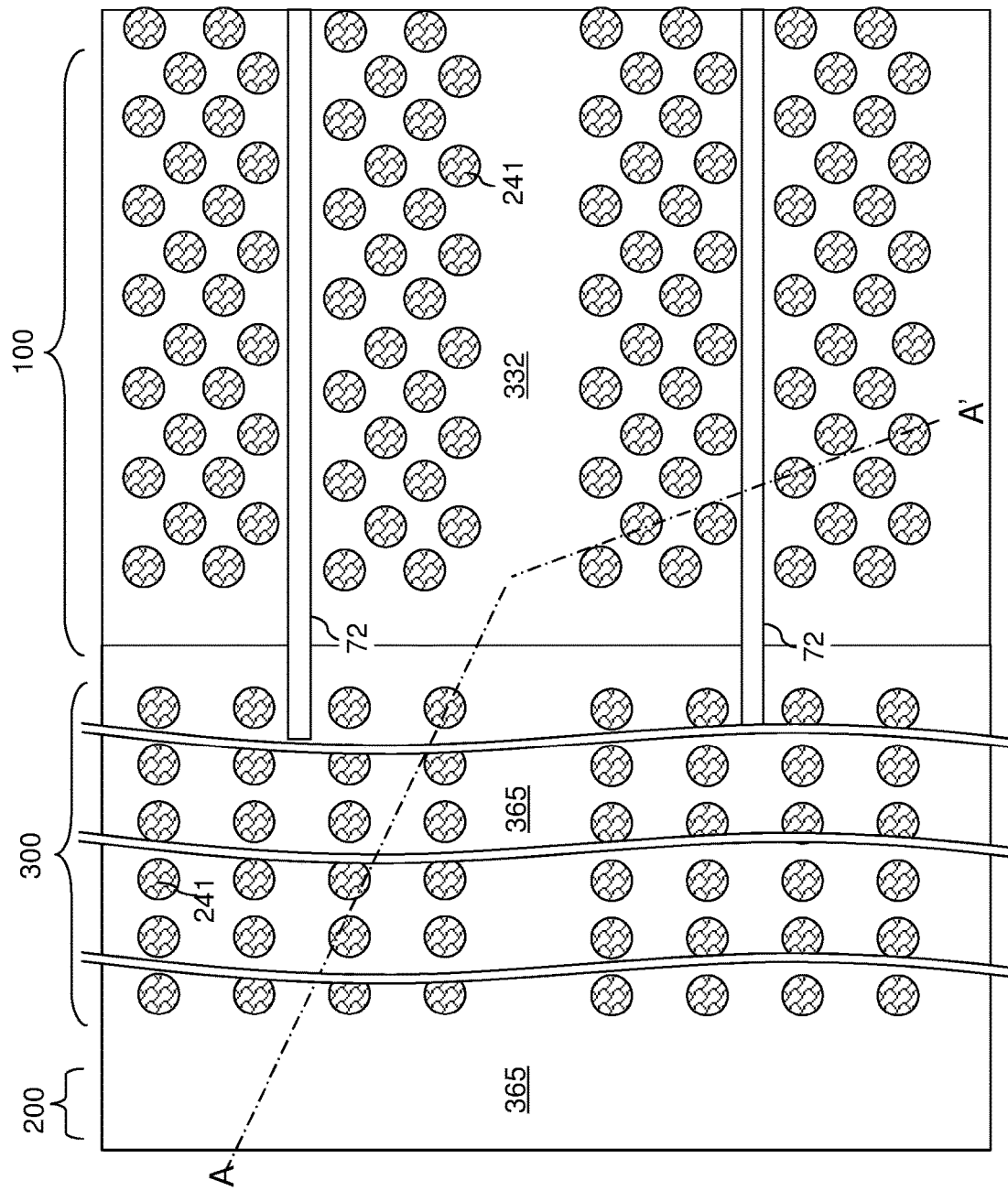
FIG. 10B is a top-down view of the exemplary structure of FIG. 10A. The vertical plane A-A' is the plane of the cross-section for FIG. 10A.

Referring to FIGS. 10A and 10B, a lithographic material stack (not shown) including at least a photoresist layer can be formed over the third alternating stack (332, 342) and the third retro-stepped dielectric material portion 365, and can be lithographically patterned to form openings therein. The openings include a first set of openings formed over the second in-process memory opening fill structures and a third set of openings formed over the second in-process support opening fill structures. The pattern in the lithographic material stack can be transferred through the third alternating stack (332, 342) and/or the third retro-stepped dielectric material portion 365 by at least one anisotropic etch that employs the patterned lithographic material stack as an etch mask. Portions of the third alternating stack (332, 342) underlying the openings in the patterned lithographic material stack are etched to form third memory openings 349 and third support openings 319. The third memory openings 349 extend through the entirety of the third alternating stack (332, 342). The third support openings 319 extend through a subset of layers within the third alternating stack (332, 342). The patterned lithographic material stack can be subsequently removed, for example, by ashing. A two-dimensional array of third memory openings 349 can be formed in the memory array region 100. A two-dimensional array of third support openings 319 can be formed in the staircase region 300. Each vertical stack of a first memory opening 149, a second memory openings 249, and a third memory opening 349 is herein referred to as an inter-tier memory opening, or a memory opening. Each vertical stack of a first support opening 149, a second support openings 249, and a third support opening 349 is herein referred to as an inter-tier support opening, or a support opening.

Figure 11:
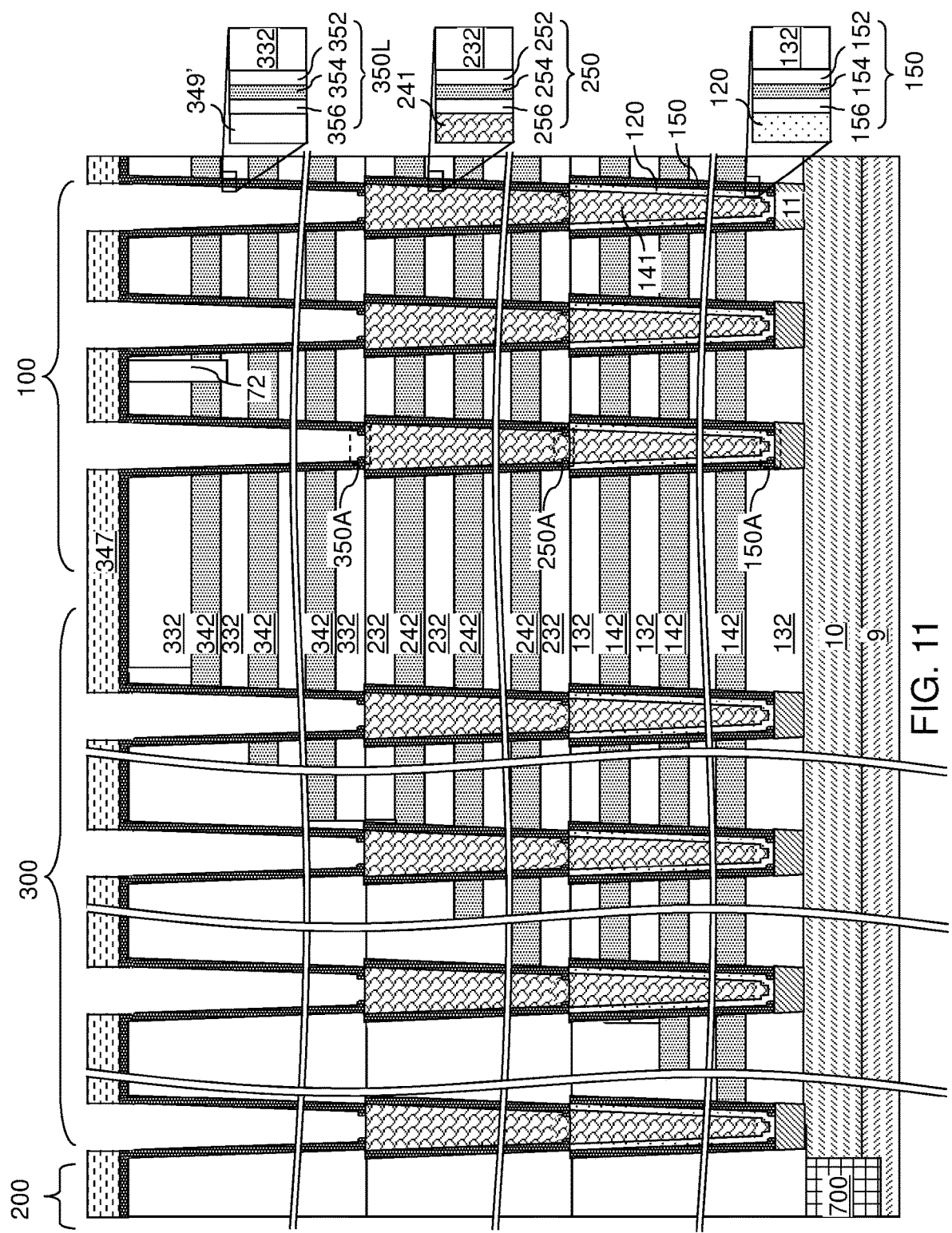
FIG. 11 is a schematic vertical cross-sectional view of the exemplary structure after deposition of a third memory film layer and a third patterning film, and an anisotropic etch of bottom portions of the third memory film layer according to an embodiment of the present disclosure.

Referring to FIG. 11, a third memory film layer 350L can be deposited on the top surface of each of the second in-process memory opening fill structures and the second in-process support opening fill structures, sidewalls of the third memory openings 349 and sidewalls of the third support openings 319, and top surfaces of the topmost third insulating layer 332 and the third retro-stepped dielectric material portion 365. The third memory film layer 350L includes a stack of layers containing a third blocking dielectric layer 352, a third charge storage layer 354, and a third tunneling dielectric layer 356 can be sequentially deposited in the third memory openings 349.

The third blocking dielectric layer 352 can have the same material composition and the same thickness as the first blocking dielectric layer 152. The third charge storage layer 354 can have the same material composition and the same thickness as the first charge storage layer 154. The third tunneling dielectric layer 356 can have the same material composition and the same thickness as the first tunneling dielectric layer 156.

A third patterning film 347 can be anisotropically deposited over the third memory film layer 350L. The third patterning film 347 includes a carbon-based material that can be subsequently employed as an etch mask material. In one embodiment, the third patterning film 347 can include amorphous carbon and/or diamond-like carbon (DLC). The third patterning film 347 can be deposited by an anisotropic deposition process such that the thickness of the third patterning film 347 in the memory openings 349 and in the support openings decreases with a vertical distance from the topmost horizontal surface of the third memory film layer 350L that overlies the third alternating stack (332, 342). Thus, the thickness of the third memory film layer 350L at the bottom of the third memory openings 349 and the third support openings 319 is less than the thickness of the third memory film layer 350L that overlies the topmost surface of the third memory film layer 350L.

An anisotropic etch process can be performed to etch the horizontal portions of the third memory film layer 350L at the bottom of each third memory openings 349 and at the bottom of each third support openings 319. Vertical portions of the third patterning film 347 and a thick horizontal portion of the third patterning film 347 that overlie the topmost surface of the third memory film layer 350L protect underlying portions of the third memory film layer 350L, while bottommost portions of the third memory film layer 350L are etched through. Openings are formed at the bottommost portions of the third memory film layer 350L that overlie a respective one of the second in-process memory opening fill structures and the second in-process support opening fill structures. Due to a finite thickness of remaining vertical portions of the third patterning film 347 on inner sidewalls of the third memory film layer 350L, the third memory film layer 350L can include horizontal annular portions 350A that laterally protrude inward from a bottom end of each cylindrical portion of the third memory film layer 350L. Each second memory film 250 can include a horizontal annular portion 250A that laterally protrudes inward from a bottom end of the cylindrical portion of the second memory film 250. Each first memory film layer 150 can include a horizontal annular portion 150A that laterally protrudes inward from a bottom end of the cylindrical portion of the first memory film 150.

Figure 12C:
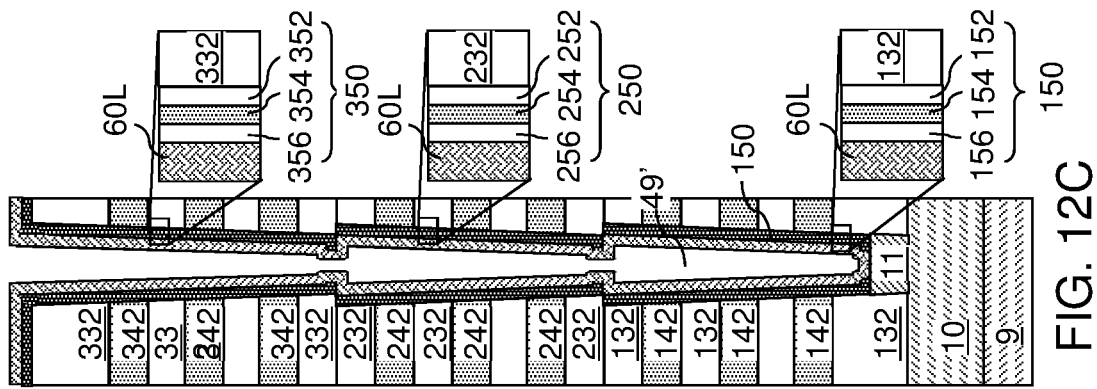
Figure 12B:
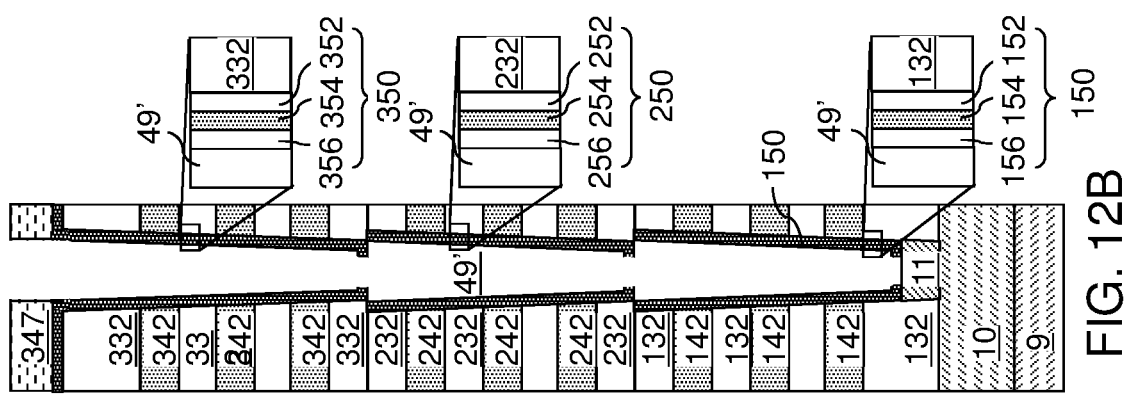
Figure 12A:
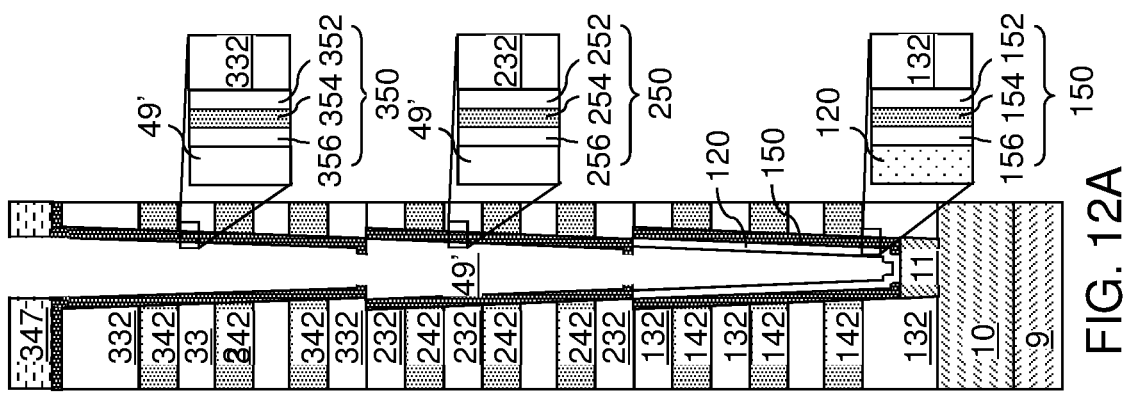

Referring to FIG. 12A, an etch process can be performed to remove the second-tier opening fill material portions 241 and the first-tier opening fill material portions 141 selective to the materials of the physically exposed portions of the third memory film layer 350L, the second memory films 250, and the sacrificial dielectric liners 120. For example, if the second-tier opening fill material portions 241 and the first-tier opening fill material portions 141 include a semiconductor material such as amorphous silicon, polysilicon, or a silicon-germanium alloy, a wet etch process employing hot trimethyl-2 hydroxyethyl ammonium hydroxide ("hot TMY") or tetramethyl ammonium hydroxide (TMAH) may be performed to remove the second-tier opening fill material portions 241 and the first-tier opening fill material portions 141 selective to the materials of the physically exposed portions of the third memory film layer 350L, the second memory films 250, and the sacrificial dielectric liners 120.

For example, amorphous silicon of the opening fill material portions has a higher etch rate (e.g., at least 100 times higher, such as 100 to 120 times higher) in TMY than borosilicate glass material of the sacrificial dielectric liner 120. Thus, the sacrificial dielectric liner 120 functions as an etch stop layer during the selective etching of the opening fill material portions. Alternatively, a chemical dry etching process may be performed to remove the second-tier opening fill material portions 241 and the first-tier opening fill material portions 141 selective to the materials of the physically exposed portions of the third memory film layer 350L, the second memory films 250, and the sacrificial dielectric liners 120. Each continuous void that vertically extends through the alternating stacks (132, 142, 232, 242, 332, 342) in the memory array region 100 constitutes a memory cavity 49'. Each continuous void that vertically extends through the alternating stacks (132, 142, 232, 242, 332, 342) in the memory array region 100 constitutes a support cavity. Thus, the BSG sacrificial dielectric liners 120 protect the silicon pedestal channel portions 11 from damage during removal of silicon first-tier and second-tier opening fill material portions (141, 241). If the sacrificial dielectric liners 120 were not present, then the silicon pedestal channel portions 11 would be damaged (e.g., etched) during removal of silicon first-tier and second-tier opening fill material portions (141, 241) by TMY or TMAH.

Referring to FIG. 12B, a selective etch process can be performed to remove the sacrificial dielectric liners 120 selective to the third memory film layer 350L, the second memory films 250, the first memory films 150, and the pedestal channel portions 11. Generally, the sacrificial dielectric liners 120 includes a dielectric material that can be removed selective to the third memory film layers 350L, the second memory films 250, the first memory films 150 (i.e., the inner portion of the respective tunneling dielectrics in the memory films), and the pedestal channel portions 11 with a selectivity greater than 100, which can be greater than 500, such as 1,000 to 16,000. In one embodiment, the sacrificial dielectric liners 120 can include borosilicate glass, and selective etch process may comprise a VPC process. The VPC process may include using HF vapor at a temperature above 50° C., such as 70 to 100° C. to selectively etch the sacrificial dielectric liners 120. The VPC process may include flowing 20 to 50 L/min, such as 30 to 40 L/min of HF vapor and 20 to 50 L/min, such as 30 to 40 L/min of a carrier gas, such as nitrogen. The VPC process provides a borosilicate glass etch rate which is 2,000 to 4,000 higher than that of densified TEOS silicon dioxide, and which is 5,000 to 16,000 higher than that of thermal CVD silicon dioxide, which may be used to form the inner portion of the tunneling dielectric 156. A top surface of a pedestal channel portion 11 can be physically exposed at the bottom of each memory cavity 49' and at the bottom of each support cavity. The third patterning film 347 can be removed, for example, by ashing. Since the VPC process does not substantially etch the silicon pedestal channel portions 11 during the removal of the BSG sacrificial dielectric liners 120. Thus, the silicon pedestal channel portions 11 are not damaged during the selective etching of the BSG sacrificial dielectric liners 120 by the VPC process.

Referring to FIG. 12C, a semiconductor channel material layer 60L can be formed as a continuous material layer on the physically exposed surfaces of the third memory film layer 350L, the second memory films 250, the first memory films 150, and the pedestal channel portions 11. The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The semiconductor channel material layer 60L can include a doped semiconductor material having a doping of first conductivity type. The atomic concentration of dopants of the first conductivity type in the semiconductor channel material layer 60L can be in a range from $1.0 \times 10^4/\text{cm}^3$ to $1.0 \times 10^{18}/\text{cm}^3$, although lesser and greater dopant concentrations can also be employed. The thickness of the semiconductor channel material layer 60L can be in a range from 2 nm to 10 nm, although lesser and greater thicknesses can also be employed.

Referring to FIG. 12D, a dielectric core material can be deposited on the semiconductor channel material layer 60L by a conformal deposition process. The dielectric core material can include a silicon oxide material such as undoped silicate glass, a doped silicate glass, or organosilicate glass. The dielectric core material can be deposited, for example, by low pressure chemical vapor deposition. Voids 67 that are free of any solid phase material may optionally be formed within unfilled volumes of the inter-tier memory openings and/or within unfilled volumes of the inter-tier support openings. Alternatively, the voids may be omitted. The deposited dielectric core material forms a dielectric core material layer 62L.

Referring to FIG. 12E, portions of the dielectric core material layer 62L, the semiconductor channel material layer 60L, and the third memory film layer 350L that overlie the horizontal plane including the top surface of the topmost one of the third insulating layers 332 (or the topmost insulating layer of the topmost alternating stack in general) can be removed by a planarization process, which can employ at least one recess etch process and/or chemical mechanical planarization. The dielectric core material layer 62L and the semiconductor channel material layer 60L can be further recessed below the horizontal plane including the top surface of the topmost one of the third insulating layers 332, for example, by recess etch processes. Remaining portions of the dielectric core material layer 62L and the semiconductor channel material layer 60L can have top surfaces between the horizontal plane including the top surface of the topmost one of the third insulating layers 332 and the horizontal plane including the bottom surface of the topmost one of the third insulating layers 332. Each remaining portion of the dielectric core material layer 62L constitutes a dielectric core 62. Each remaining portion of the semiconductor channel material layer 60L constitutes a vertical semiconductor channel 60. Each remaining portion of the third memory film layer 350L constitutes a third memory film 350. Generally, each dielectric core 62 may be formed by depositing a dielectric material on an inner sidewall of a vertical semiconductor channel 60.

Each vertical semiconductor channel 60 can be formed on a vertical stack of a first memory film 150, a second memory film 250, and a third memory film 350. Each vertical semiconductor channel 60 may be formed directly on a pedestal channel portion 11. Each first memory film layer 150 can include a horizontal annular portion 150A that laterally protrudes inward from a bottom end of the cylindrical portion of the first memory film 150. Each second memory film 250 can include a horizontal annular portion 250A that laterally protrudes inward from a bottom end of the cylindrical portion of the second memory film 250. Each third memory film 350 can include a horizontal annular portion 350A that laterally protrudes inward from a bottom end of the cylindrical portion of the third memory film 350. Each of the vertical semiconductor channels 60 can comprise a first laterally undulating portion 601 contacting a horizontal annular portion of a respective first memory film 150, a second laterally undulating portion 602 contacting a horizontal annular portion of a respective second memory film 250, and a third laterally undulating portion 603 contacting a horizontal annular portion of a respective third memory film 350. As used herein, an element is "undulating" if surfaces of the element protrude or are recessed along a direction that is perpendicular to the lengthwise direction of the element along which the element has the greatest extent.

Figure 13:
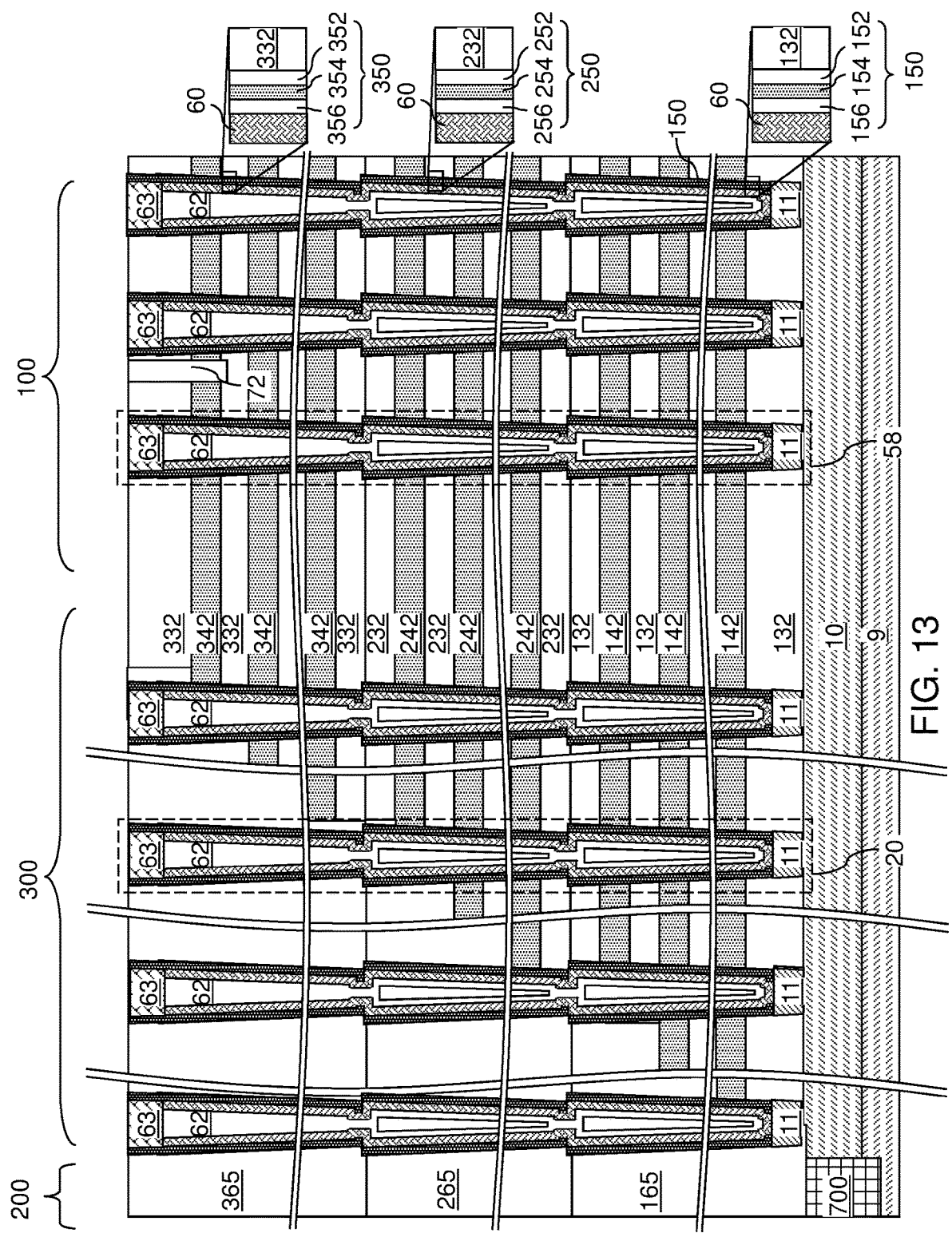
FIG. 13 is a schematic vertical cross-sectional view of the exemplary structure after formation of memory opening fill structures and support pillar structures according to an embodiment of the present disclosure.

Referring to FIGS. 12F and 13, a doped semiconductor material having a doping of the second conductivity type can be deposited in each recessed volume of the inter-tier memory openings and the inter-tier support openings. The doped semiconductor material can include polysilicon or amorphous silicon that can be subsequently annealed to form polysilicon. Excess portions of the doped semiconductor material overlying the horizontal plane including the top surface of the topmost third insulating layer 332 can be removed by a planarization process such as a recess etch. Each remaining portion of the doped semiconductor material constitutes a drain region 63. The atomic concentration of dopants of the second conductivity type in the drain regions 63 can be in a range from $5.0 \times 10^{19}/\text{cm}^3$ to $2.0 \times 10^{21}/\text{cm}^3$, although lesser and greater dopant concentrations can also be employed. A drain region 63 is formed on a top end of each vertical semiconductor channel 60.

As shown in FIG. 13, memory opening fill structure 58 is formed within each inter-tier memory opening, and a support pillar structure 20 is formed within each inter-tier support opening. Each memory opening fill structure 58 and each support pillar structure 20 can include a respective set of a pedestal channel portion 11, at least two memory films (such as a first memory film 150, a second memory film 250, and a third memory film 350), a vertical semiconductor channel 60 contacting each of the at least two memory films, a dielectric core 62 (which may optionally include voids 67 therein), and a drain region 63. Each contiguous combination of a vertical semiconductor channel 60 and at least two memory films (150, 250, 350) constitutes a memory stack structure configured to store memory bits therein.

Figure 14A:
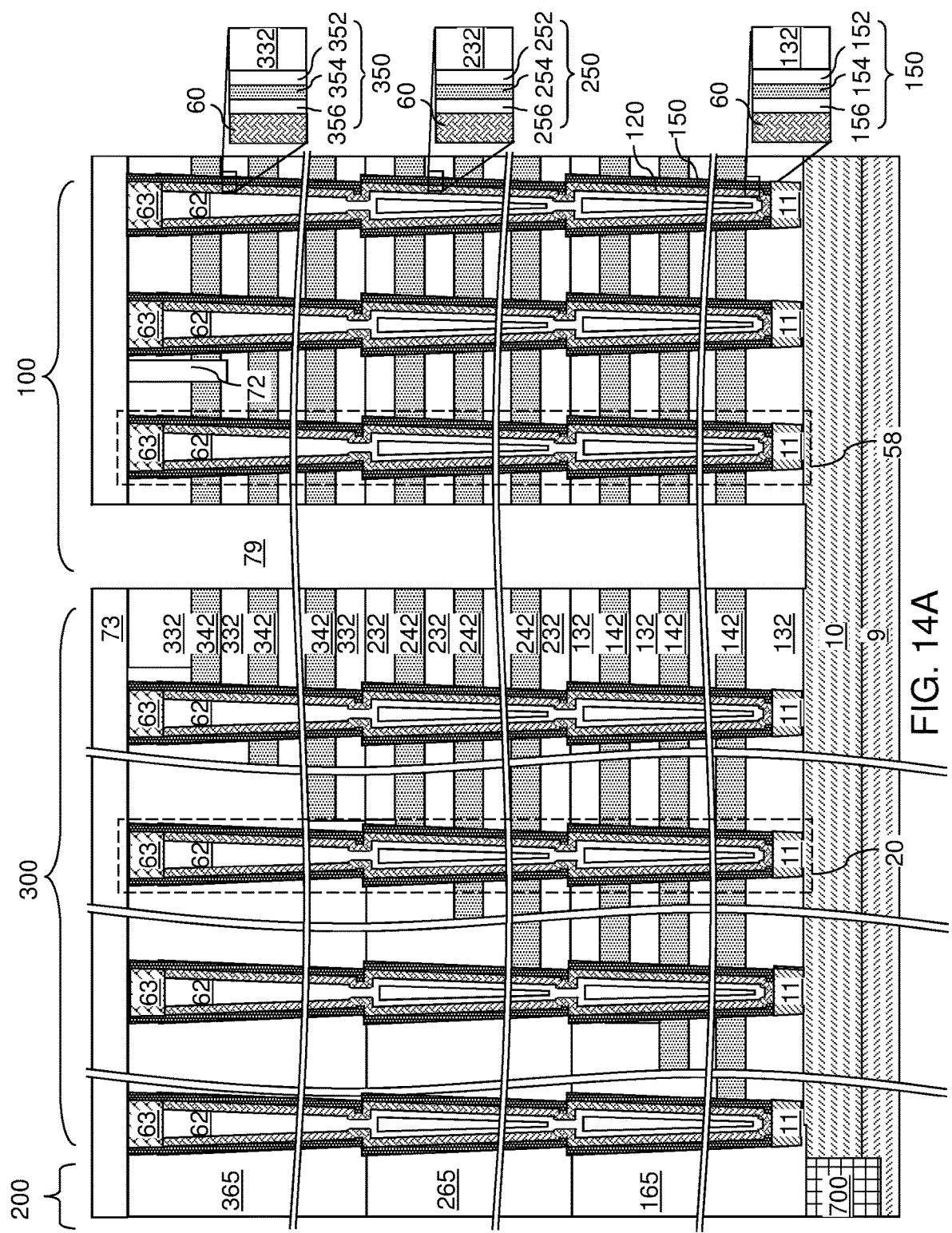
FIG. 14A is a schematic vertical cross-sectional view of the exemplary structure after formation of backside trenches according to an embodiment of the present disclosure.
Figure 14B:
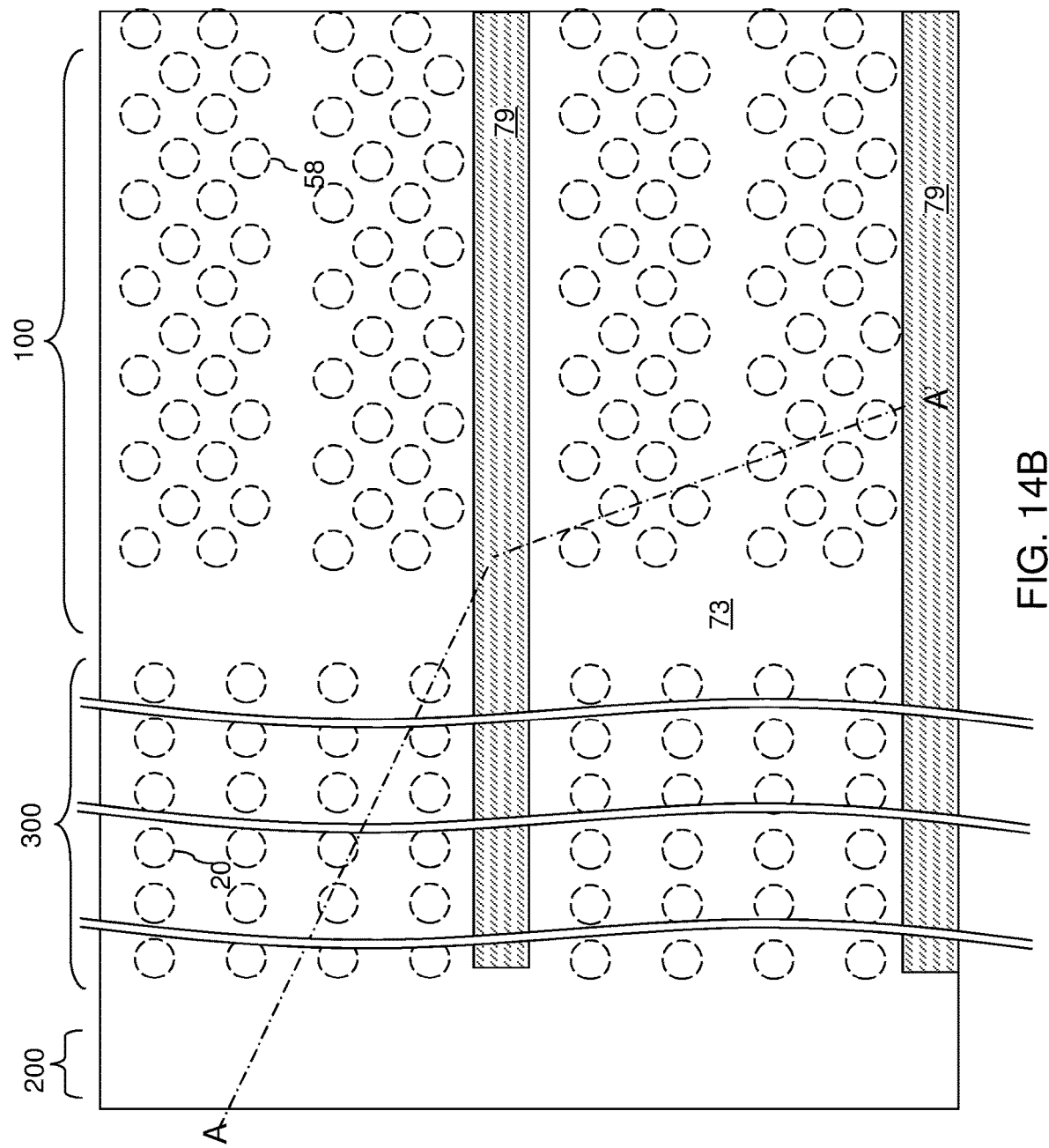
FIG. 14B is a partial see-through top-down view of the exemplary structure of FIG. 14A. The vertical plane A-A' is the plane of the schematic vertical cross-sectional view of FIG. 14A.

Referring to FIGS. 14A and 14B, a contact level dielectric layer 73 can be formed over the alternating stacks (132, 142, 232, 242, 332, 342) of insulating layers (132, 232, 332) and sacrificial material layers (142, 242, 342), and over the memory opening fill structure 58 and the support pillar structures 20. The contact level dielectric layer 73 includes a dielectric material that is different from the dielectric material of the sacrificial material layers (142, 242, 342). For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory opening fill structure 58. The pattern in the photoresist layer can be transferred through the contact level dielectric layer 73, the alternating stacks (132, 142, 232, 242, 332, 342) and/or the retro-stepped dielectric material portions (165, 265, 365) employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory opening fill structure 58 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory opening fill structure 58 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 15:
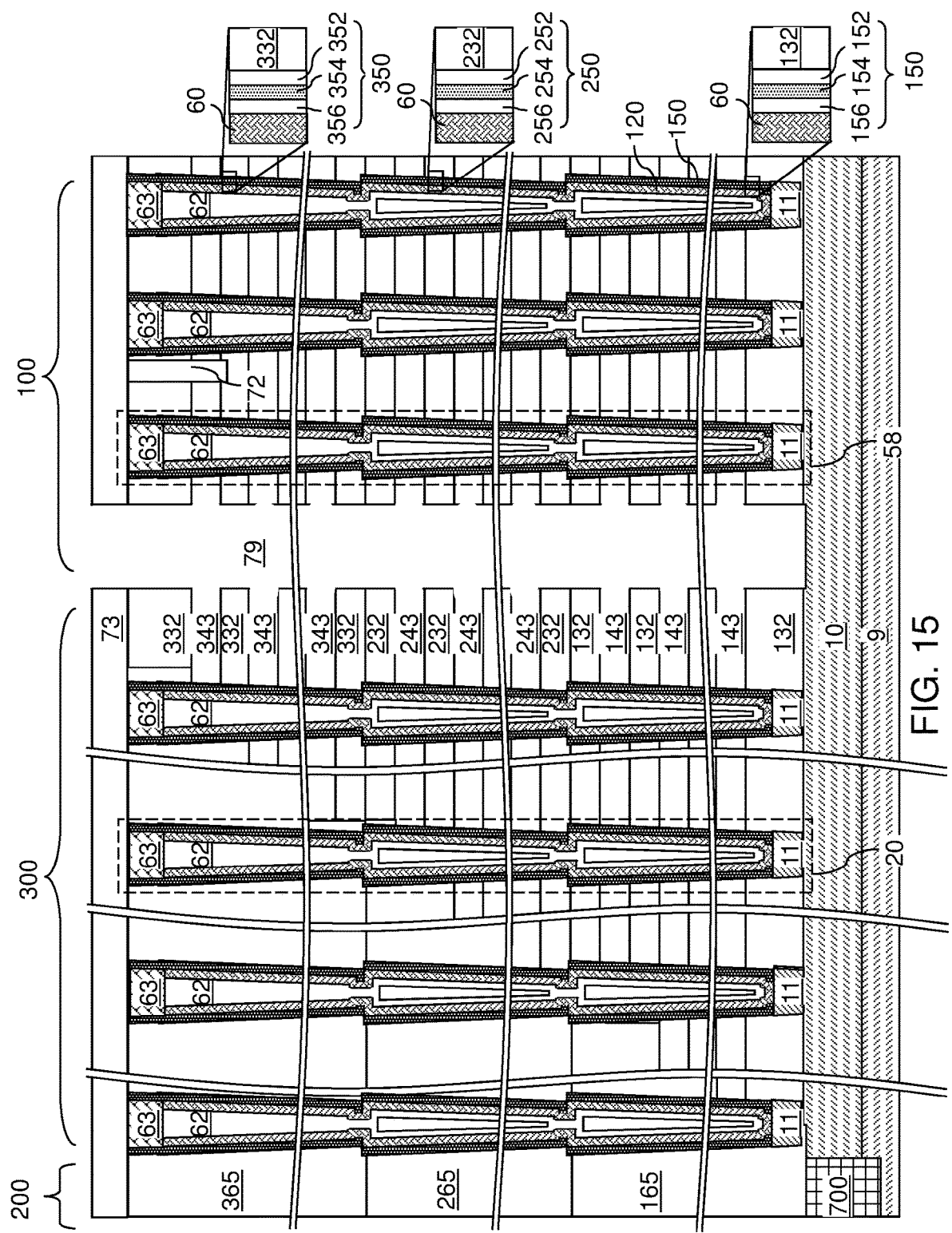
FIG. 15 is a schematic vertical cross-sectional view of the exemplary structure after formation of backside recesses according to an embodiment of the present disclosure.

Referring to FIG. 15, an etchant that selectively etches the second material of the sacrificial material layers (142, 242, 342) with respect to the first material of the insulating layers (132, 232, 332) can be introduced into the backside trenches 79, for example, employing an etch process. Backside recesses (143, 243, 343) are formed in volumes from which the sacrificial material layers (142, 242, 342) are removed. The backside recesses (143, 242, 343) can include first backside recesses 143 that are formed in volumes from which the first sacrificial material layers 142 are removed, second backside recesses 243 that are formed in volumes from which the second sacrificial material layers 242 are removed, and third backside recesses 343 that are formed in volumes from which the third sacrificial material layers 342 are removed. The removal of the second material of the sacrificial material layers (142, 242, 342) can be selective to the material of the insulating layers (132, 232, 332), the material of the retro-stepped dielectric material portions (165, 265, 365), the semiconductor material of the semiconductor material layer 10, and the material of the outermost layer of the memory films (150, 250, 350). In one embodiment, the sacrificial material layers (142, 242, 342) can include silicon nitride, and the materials of the insulating layers (132, 232, 332) and the retro-stepped dielectric material portions (165, 265, 365) can be selected from silicon oxide and dielectric metal oxides.

The etch process that removes the second material selective to the first material and the outermost layer of the memory films (150, 250, 350) can be a wet etch process employing a wet etch solution, or can be a gas phase (dry) etch process in which the etchant is introduced in a vapor phase into the backside trenches 79. For example, if the sacrificial material layers (142, 242, 342) include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portions (165, 265, 365), and the memory opening fill structure 58 provide structural support while the backside recesses (143, 243, 343) are present within volumes previously occupied by the sacrificial material layers (142, 242, 342).

Each backside recess (143, 243, 343) can be a laterally extending cavity having a lateral dimension that is greater than the vertical extent of the cavity. In other words, the lateral dimension of each backside recess (143, 243, 343) can be greater than the height of the backside recess (143, 243, 343). A plurality of backside recesses (143, 243, 343) can be formed in the volumes from which the second material of the sacrificial material layers (142, 242, 342) is removed. The first memory openings in which the memory opening fill structure 58 are formed are herein referred to as front side openings or front side cavities in contrast with the backside recesses (143, 243, 343). In one embodiment, the memory array region 100 comprises an array of monolithic three-dimensional NAND strings having a plurality of device levels disposed above the substrate (9, 10). In this case, each backside recess (143, 243, 343) can define a space for receiving a respective word line of the array of monolithic three-dimensional NAND strings.

Each of the plurality of backside recesses (143, 243, 343) can extend substantially parallel to the top surface of the substrate (9, 10). A backside recess (143, 243, 343) can be vertically bounded by a top surface of an underlying insulating layer (132, 232, 332) and a bottom surface of an overlying insulating layer (132, 232, 332). In one embodiment, each backside recess (143, 243, 343) can have a uniform height throughout.

Figure 16:
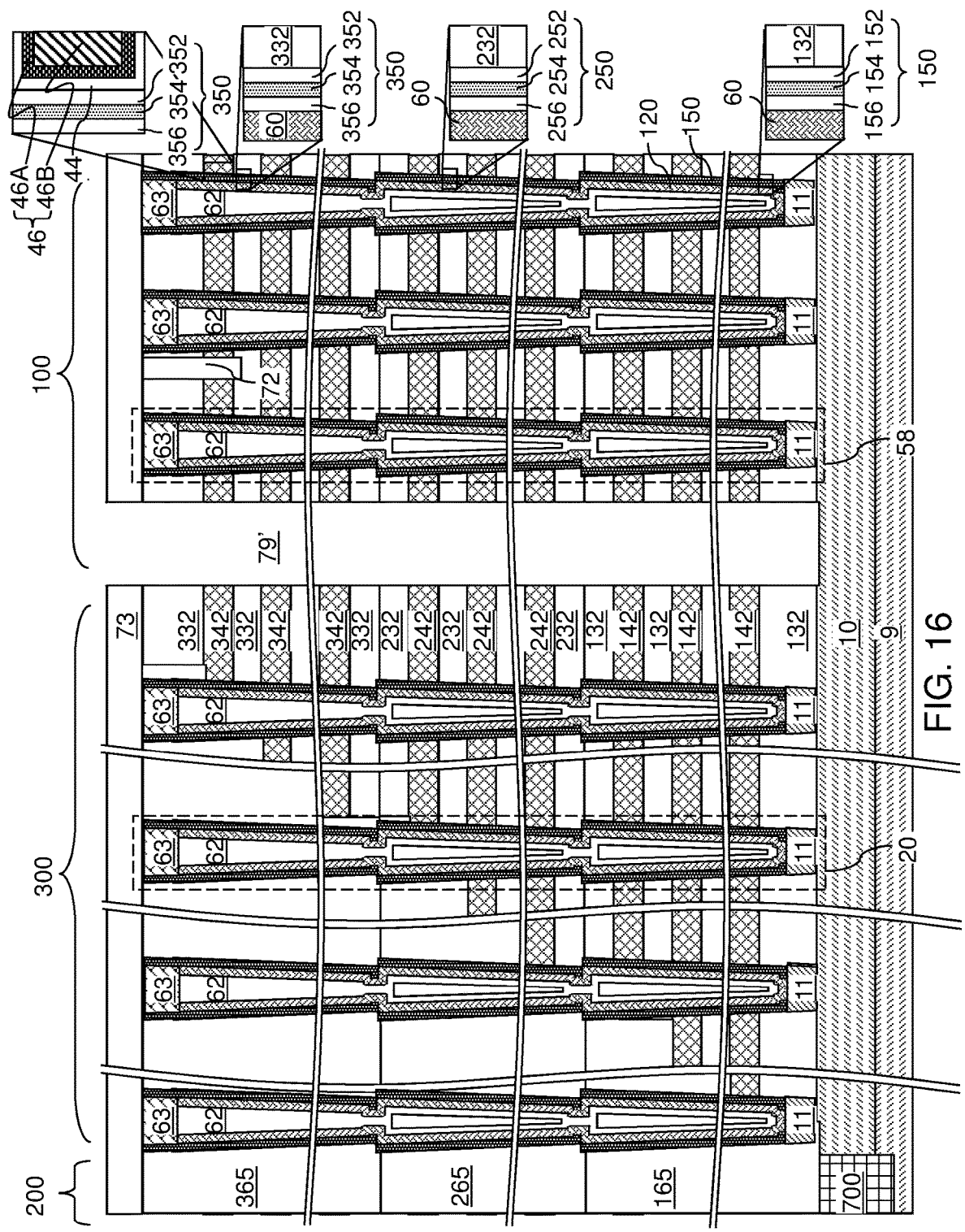
FIG. 16 is a schematic vertical cross-sectional view of the exemplary structure after formation of electrically conductive layers according to an embodiment of the present disclosure.

Referring to FIG. 16, a backside blocking dielectric layer 44 may be optionally formed in the backside recesses. The backside blocking dielectric layer 44, if present, comprises a dielectric material that functions as a control gate dielectric for the control gates to be subsequently formed in the backside recesses (143, 243, 343). In case the blocking dielectric layers (152, 252, 352) are present within each memory opening, the backside blocking dielectric layer 44 is optional. In case the blocking dielectric layers (152, 252, 352) are omitted, the backside blocking dielectric layer 44 is present.

The backside blocking dielectric layer 44 can be formed in the backside recesses (143, 243, 343) and on a sidewall of the backside trench 79. The backside blocking dielectric layer 44 can be formed directly on horizontal surfaces of the insulating layers (132, 232, 332) and sidewalls of the memory opening fill structure 58 within the backside recesses (143, 243, 343). In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers (132, 232, 332), and the portions of the sidewall surfaces of the memory opening fill structure 58 that are physically exposed to the backside recesses (143, 243, 343). A backside cavity 79' is present within the portion of each backside trench 79 that is not filled with the backside blocking dielectric layer 44.

A metallic barrier layer 46A can be deposited in the backside recesses (143, 243, 343). The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses (143, 243, 343), on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers (132, 232, 332) and the memory opening fill structure 58 by the metallic barrier layer 46A, which is a metallic barrier layer that blocks diffusion of fluorine atoms therethrough.

A plurality of electrically conductive layers (146, 246, 346) can be formed in the plurality of backside recesses (143, 243, 343), and a continuous electrically conductive material layer can be formed on the sidewalls of each backside trench 79 and over the contact level dielectric layer 73. Each electrically conductive layer (146, 246, 346) includes a portion of the metallic barrier layer 46A and a portion of the metallic fill material layer 46B that are located between a vertically neighboring pair of dielectric material layers such as a pair of insulating layers (132, 232, 332). The continuous electrically conductive material layer includes a continuous portion of the metallic barrier layer 46A and a continuous portion of the metallic fill material layer 46B that are located in the backside trenches 79 or above the contact level dielectric layer 73.

Each sacrificial material layer (142, 242, 342) can be replaced with an electrically conductive layer (146, 246, 346). A backside cavity 79' is present in the portion of each backside trench 79 that is not filled with the backside blocking dielectric layer 44 and the continuous electrically conductive material layer.

The deposited metallic material of the continuous electrically conductive material layer is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses (143, 243, 343) constitutes an electrically conductive layer (146, 246, 346). Each electrically conductive layer (146, 246, 346) can be a conductive line structure. Thus, the sacrificial material layers (142, 242, 342) are replaced with the electrically conductive layers (146, 246, 346).

Each electrically conductive layer (146, 246, 346) can function as a combination of a plurality of control gate electrodes located at a same level and a word line electrically interconnecting, i.e., electrically shorting, the plurality of control gate electrodes located at the same level. The plurality of control gate electrodes within each electrically conductive layer (146, 246, 346) are the control gate electrodes for the vertical memory devices including the memory opening fill structure 58. In other words, each electrically conductive layer (146, 246, 346) can be a word line that functions as a common control gate electrode for the plurality of vertical memory devices.

In one embodiment, the removal of the continuous electrically conductive material layer can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer may not be selective to the material of the backside blocking dielectric layer 44 or, the backside blocking dielectric layer 44 may not be employed. A backside cavity 79' is present within each backside trench 79.

Figure 17:
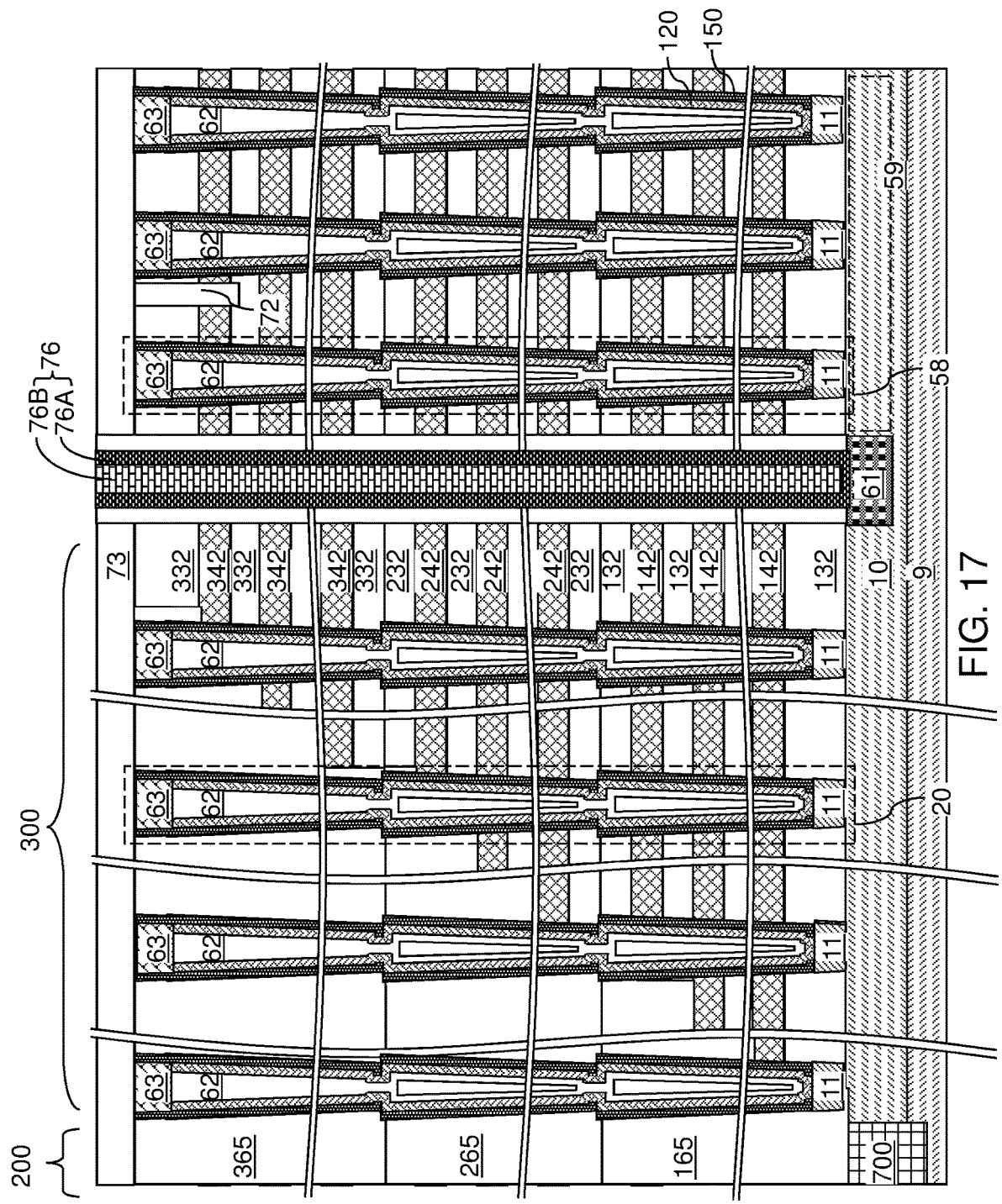
FIG. 17 is a schematic vertical cross-sectional view of the exemplary structure after formation of an insulating spacer and a backside contact structure according to an embodiment of the present disclosure.

Referring to FIG. 17, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers (146, 246, 346). If a backside blocking dielectric layer 44 is not employed, the insulating material layer can be formed directly on sidewalls of the insulating layers (132, 232, 332) and directly on sidewalls of the electrically conductive layers (146, 246, 346).

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost first electrically conductive layer 146 provided upon formation of the electrically conductive layers (146, 246, 346) within the alternating stacks (132, 146, 232, 246, 332, 346) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory opening fill structure 58.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stacks (132, 146, 232, 246, 332, 346) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stacks (132, 146, 232, 246, 332, 346), and contacts a top surface of the source region 61. If a backside blocking dielectric layer 44 is employed, the backside contact via structure 76 can contact a sidewall of the backside blocking dielectric layer 44.

Figure 18A:
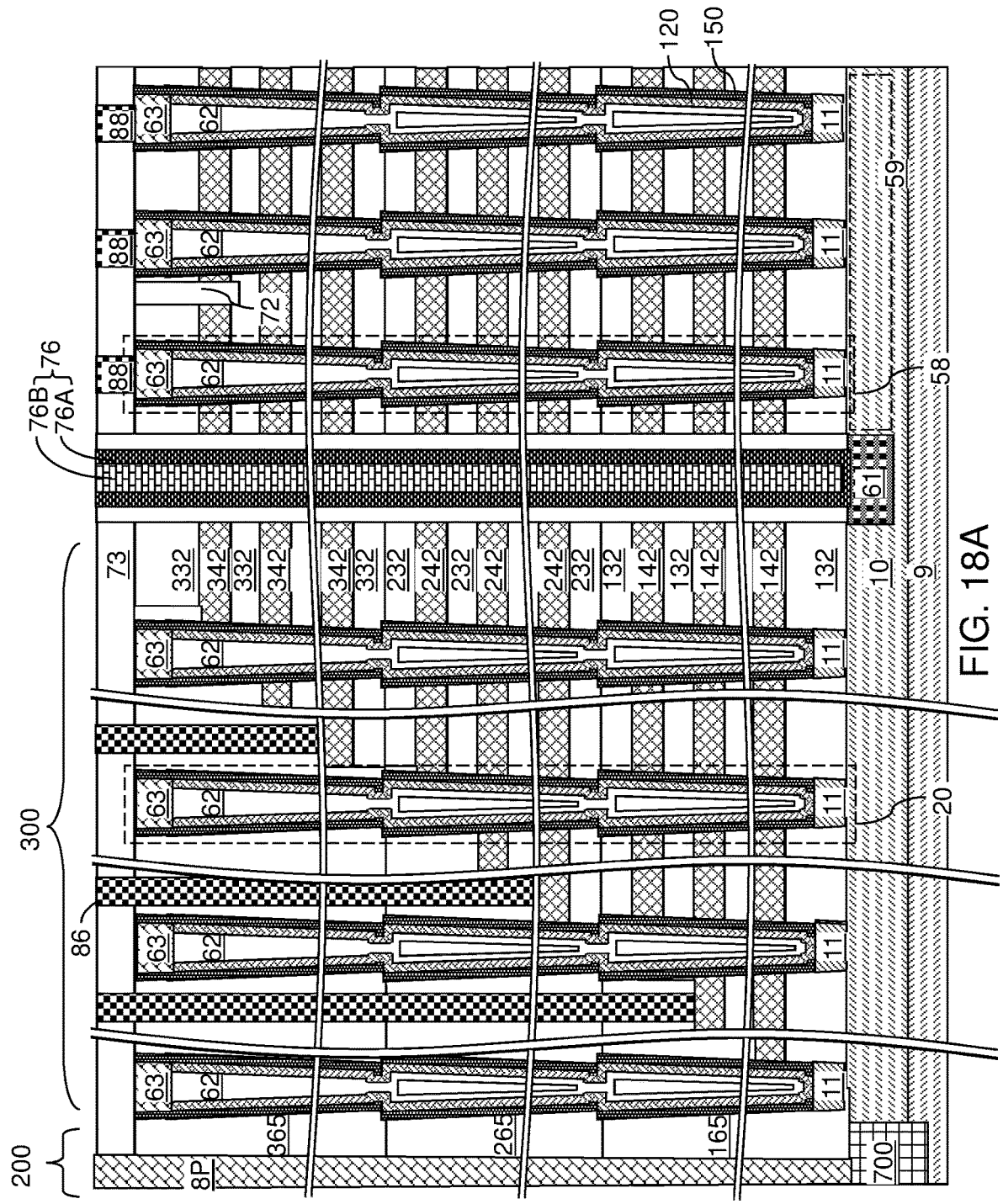
FIG. 18A is a schematic vertical cross-sectional view of the exemplary structure after formation of additional contact via structures according to an embodiment of the present disclosure.
Figure 18B:
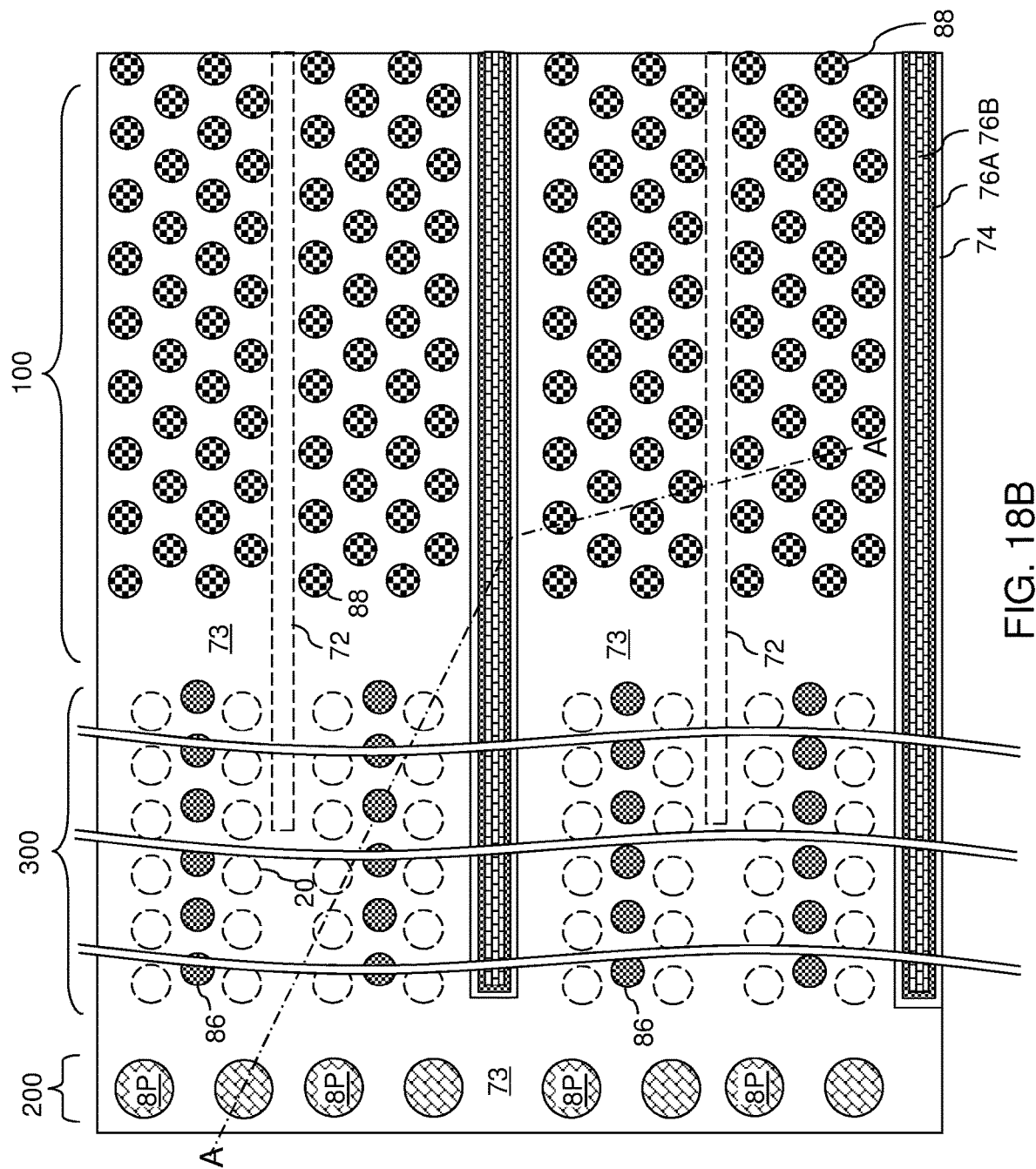
FIG. 18B is a top-down view of the exemplary structure of FIG. 18A. The vertical plane A-A' is the plane of the schematic vertical cross-sectional view of FIG. 18A.

Referring to FIGS. 18A and 18B, additional contact via structures (88, 86, 8P) can be formed through the contact level dielectric layer 73, and through the retro-stepped dielectric material portions (165, 265, 365). For example, drain contact via structures 88 can be formed through the contact level dielectric layer 73 on each drain region 63. Word line contact via structures 86 can be formed on the electrically conductive layers (146, 246, 346) through the contact level dielectric layer 73, and through the retro-stepped dielectric material portions (165, 265, 365). Peripheral device contact via structures 8P can be formed through the retro-stepped dielectric material portions (165, 265, 365) directly on respective nodes of the peripheral devices.

Figure 19:
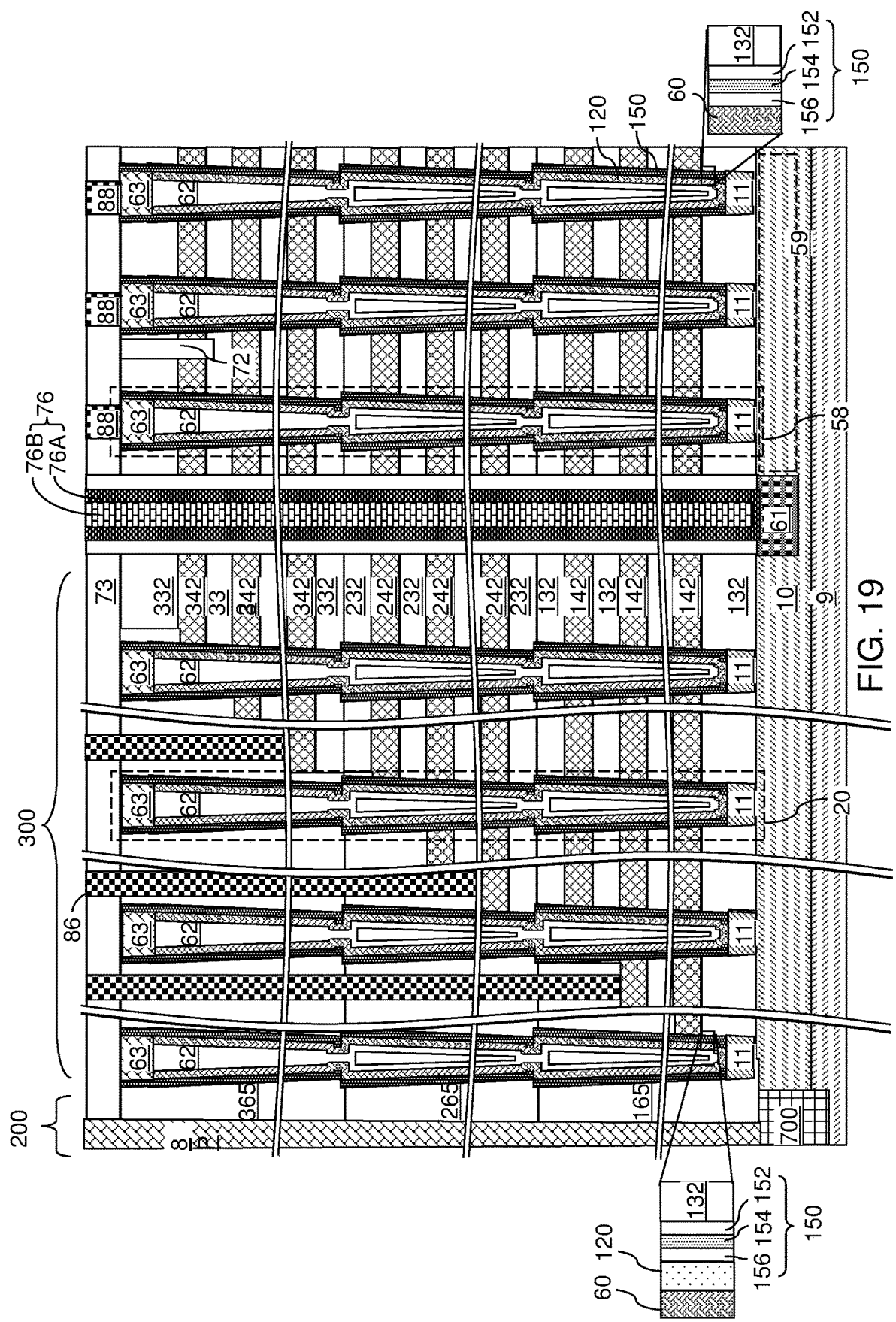
FIG. 19 is a schematic vertical cross-sectional view of an alternative exemplary structure in which the sacrificial liner is retained in the support pillar structure according to an alternative embodiment of the present disclosure.

FIG. 19 illustrates an alternative exemplary structure of an alternative embodiment. This structure includes the sacrificial liner, such as the sacrificial dielectric liner 120, located between the dummy memory film 150 and the dummy semiconductor channel 60 in the support pillar structures 20. The retained dielectric liner 120 reduces or prevents unintentional leakage current between the word lines (146, 246, 346) and the underlying dummy pedestal channel portions 11 through the dummy semiconductor channel 160 located in the support opening 19 even if there is a gap in the dummy memory film (150, 250, 350) of the support pillar structure 20. However, the sacrificial liner, such as the sacrificial dielectric liner 120, is not present (i.e., omitted) in between the memory film 150 and the semiconductor channel 60 in the memory opening fill structure 58. The structure of the alternative embodiment of FIG. 19 may be formed by masking the support openings 19 during the etching step shown in FIG. 12B, to retain the sacrificial dielectric liner 120 in the support openings 19, while the sacrificial dielectric liner 120 is selectively etched and thus removed from the memory openings 49.

The exemplary structures can include a three-dimensional memory device. In one embodiment, the three-dimensional memory device comprises a monolithic three-dimensional NAND memory device. The electrically conductive layers (146, 246, 346) can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. Memory cells (comprising portions of the charge storage layers (154, 254, 354) at levels of the electrically conductive layers (146, 246, 346)) can be located at multiple levels of the array of monolithic three-dimensional NAND strings. The silicon substrate can contain an integrated circuit comprising a driver circuit (comprising a subset of the least one semiconductor device 700) for the memory device located thereon. The electrically conductive layers (146, 246, 346) can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films (150, 250, 350)). Each charge storage element can be located adjacent to a respective one of the plurality of semiconductor channels (59, 11, 60).

Referring to all drawings and according to various embodiments of the present disclosure, a three-dimensional memory device is provided, which comprises: a first alternating stack of first insulating layers 132 and first electrically conductive layers 146 over a semiconductor material layer 10; a second alternating stack of second insulating layers 232 and second electrically conductive layers 246 overlying the first alternating stack (132, 146); a first memory opening 149 extending through the first alternating stack (132, 146) and including a first memory film 150 at a peripheral portion thereof; a second memory opening 249 extending through the second alternating stack (232, 246) and including a second memory film 250 at a peripheral portion thereof; a vertical semiconductor channel 60 extending through the first memory opening 149 and the second memory opening 249 and contacting inner sidewalls of the first memory film 150 and the second memory film 250, wherein the first memory film 150 comprises a horizontal annular portion 150A that laterally protrudes inward from a bottom end of a cylindrical portion of the first memory film 150.

In one embodiment, the vertical semiconductor channel 60 contacts an annular top surface of the horizontal annular portion 150A of the first memory film 150. The top of the first memory film does not contact an inner tip of a horizontal annular portion 150A that laterally protrudes inward from a bottom end of a cylindrical portion of the second memory film 250.

In one embodiment, second memory film 250 comprises a horizontal annular portion 250A that laterally protrudes inward from a bottom end of a cylindrical portion of a respective second memory film 250, and wherein the vertical semiconductor channel 60 comprises a first laterally undulating portion 601 contacting the horizontal annular portion 150A of the first memory film 150 and a second laterally undulating portion 602 contacting a horizontal annular portion 250A of the second memory film 250.

In one embodiment, each of the first memory films 150 comprises a layer stack including a first charge storage layer 154 and a first tunneling dielectric layer 156; and each of the second memory films 250 comprises a layer stack including a second charge storage layer 254 and a second tunneling dielectric layer 256.

In the alternative embodiment of FIG. 19, a support pillar structure 20 in a support opening contains a sacrificial dielectric liner 120 located between a dummy memory film 150 and a dummy vertical semiconductor channel 60, while the sacrificial dielectric liner 120 is omitted between the memory film 150 and the vertical semiconductor channel 60 in the first memory opening.

The various embodiments of the present disclosure can be employed to provide an opening through the first memory film 150 in case multiple alternating stacks are employed and inter-tier memory openings 49 are deep. Bottom etch-through processes for memory films are performed for each alternating stack, thereby eliminating the need for an anisotropic etch process that can etch a bottom portion of a single memory film located in deep inter-tier memory openings. Further, the sacrificial dielectric liners 120 can provide protection for the first memory films 150 and the pedestal channel portions 11 during removal of sacrificial memory opening fill materials, thereby preventing collateral damage to the first memory films 120 and the pedestal channel portions 11.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device comprising:
   forming a first alternating stack of first insulating layers and first spacer material layers over a semiconductor material layer;
   forming first memory openings through the first alternating stack, wherein a top surface of the semiconductor material layer is physically exposed at a bottom of each of the first memory openings;

filling each of the first memory openings with a first memory film, a sacrificial liner, and a first-tier opening fill material portion;

forming a second alternating stack of second insulating layers and second spacer material layers over the first alternating stack and the first-tier opening fill material portions;

forming second memory openings through the second alternating stack, wherein a top surface of a respective one of the first-tier opening fill material portions is physically exposed at a bottom of each of the second memory openings;

forming a second memory film within each of the second memory openings;

removing the first-tier opening fill material portions selective to the sacrificial liners;

removing the sacrificial liners selective to the second memory films and the first memory films; and forming a vertical semiconductor channel on each vertical stack of a first memory film and a second memory film;

wherein the sacrificial liners comprise sacrificial dielectric liners; and further comprising at least one feature selected from:

(a) a first feature in which:
the first insulating layers comprise undoped silicon oxide;
an inner surface of the first memory films comprises undoped silicon oxide;
the sacrificial dielectric liners comprise borosilicate glass; and
the sacrificial dielectric liners have an etch rate that is at least 100 times higher than the inner surface of the first memory film; or (b) a second feature, in which the sacrificial dielectric liners are formed by:
depositing a continuous sacrificial dielectric material layer in the first memory openings and over the first alternating stack; and
removing portions of the continuous sacrificial dielectric material layer that overlie a horizontal plane including a topmost surface of the first alternating stack,
wherein remaining portions of the continuous sacrificial dielectric material layer constitute the sacrificial dielectric liners; or (c) a third feature which comprises:
forming a second-tier opening fill material portion within each of the second memory openings directly on a respective one of the first-tier opening fill material portions on the second memory film without forming the sacrificial dielectric liner between the second memory film and the second-tier opening fill material portion;
forming a third alternating stack of third insulating layers and third spacer material layers over the second alternating stack and the second-tier opening fill material portions;
forming third memory openings through the third alternating stack, wherein a top surface of a respective one of the second-tier opening fill material portions is physically exposed at a bottom of each of the third memory openings;
forming a third memory film within each of the third memory openings; and
removing the second-tier opening fill material portions prior to removal of the first-tier opening fill material portions; or (d) a fourth feature which comprises:
forming support openings through the first and second alternating stacks; and
forming support pillar structures in the support openings,
wherein:
each support pillar structure contains a sacrificial dielectric liner located between a dummy memory film and a dummy vertical semiconductor channel; and
the sacrificial dielectric liners are not removed from the support openings during the step of removing the sacrificial dielectric liners selective to the second memory films and the first memory films located in the first and the second memory openings.

2. The method of claim 1, wherein the at least one feature comprises the first feature.

3. The method of claim 2, wherein the step of removing the sacrificial dielectric liners is performed selective to the first memory films, the second memory films, and the semiconductor material layer by hydrofluoric acid vapor.

4. The method of claim 3, wherein:
the borosilicate glass of the sacrificial dielectric liners contains a boron concentration of at least $1 \times 10^{21}$ cm$^{-3}$; and
the step of removing the sacrificial dielectric liners by hydrofluoric acid vapor is performed at a temperature of above 50° C.

5. The method of claim 4, wherein:
the first-tier opening fill material portions comprise amorphous silicon; and
the method comprises removing the amorphous silicon of the first-tier opening fill material portions selective to a material of the sacrificial dielectric liners using trimethyl-2 hydroxyethyl ammonium hydroxide.

6. The method of claim 5, further comprising forming epitaxial silicon pedestal channel portion contacting a top surface of the semiconductor material layer and a bottom portion of a sidewall of a respective one of the first memory openings,
wherein:
the step of removing the sacrificial dielectric liners by the hydrofluoric acid vapor does not etch the silicon pedestal channel portion;
each of the first memory films is formed on a peripheral portion of a top surface of a respective pedestal channel portion;
each sacrificial dielectric liner is formed on a center portion of the top surface of the respective pedestal channel portion; and
the vertical semiconductor channels are formed directly on the pedestal channel portions.

7. The method of claim 1, wherein the at least one feature comprises the second feature.

8. The method of claim 7, further comprising:
depositing an opening fill material on the continuous sacrificial dielectric material layer; and
removing portions of the opening fill material from above the horizontal plane including the topmost surface of the first alternating stack, wherein remaining portions of the opening fill material constitute the first-tier opening fill material portion.

9. The method of claim 1, wherein:
each of the first memory films comprises a layer stack including a first charge storage layer and a first tunneling dielectric layer; and each of the second memory films comprises a layer stack including a second charge storage layer and a second tunneling dielectric layer.

10. The method of claim 1, wherein the at least one feature comprises the third feature.

11. The method of claim 1, further comprising:
forming a backside trench through the second alternating stack and the first alternating stack;
forming backside recesses by removing the first spacer layers and the second spacer layers; and
forming electrically conductive layers in the backside recesses.

12. The method of claim 1, further comprising:
forming a dielectric core by depositing a dielectric core material on an inner sidewall of each vertical semiconductor channel; and
forming a drain region on a top end of each vertical semiconductor channel.

13. The method of claim 1, wherein the at least one feature comprises the fourth feature.

14. A method of forming a three-dimensional memory device comprising:
forming a first alternating stack of first insulating layers and first spacer material layers over a semiconductor material layer;
forming first memory openings through the first alternating stack, wherein a top surface of the semiconductor material layer is physically exposed at a bottom of each of the first memory openings;
filling each of the first memory openings with a first memory film, a sacrificial liner, and a first-tier opening fill material portion;
forming a second alternating stack of second insulating layers and second spacer material layers over the first alternating stack and the first-tier opening fill material portions;
forming second memory openings through the second alternating stack, wherein a top surface of a respective one of the first-tier opening fill material portions is physically exposed at a bottom of each of the second memory openings;
forming a second memory film within each of the second memory openings;
removing the first-tier opening fill material portions selective to the sacrificial liners;
removing the sacrificial liners selective to the second memory films and the first memory films:
forming a vertical semiconductor channel on each vertical stack of a first memory film and a second memory film;
depositing a first memory film layer on sidewalls of the first memory openings and over the first alternating stack;
anisotropically depositing a first patterning film over the first memory film layer; and
anisotropically etching horizontal portions of the first patterning film and horizontal portions of the first memory film layer, wherein the first memory films comprise remaining portions of the first memory film layer, and each of the first memory films comprises a horizontal annular portion that laterally protrudes inward from a bottom end of a cylindrical portion of a respective first memory film.

15. The method of claim 14, further comprising:
depositing a second memory film layer on sidewalls of the second memory openings and over the second alternating stack;
anisotropically depositing a second patterning film over the second memory film layer;
anisotropically etching horizontal portions of the second patterning film and horizontal portions of the second memory film layer, wherein the second memory films comprise remaining portions of the second memory film layer, and each of the second memory films comprises a horizontal annular portion that laterally protrudes inward from a bottom end of a cylindrical portion of a respective second memory film, and wherein each of the vertical semiconductor channels comprises a first laterally undulating portion contacting a horizontal annular portion of a respective first memory film and a second laterally undulating portion contacting a horizontal annular portion of a respective second memory film.

16. A three-dimensional memory device comprising:
a first alternating stack of first insulating layers and first electrically conductive layers over a semiconductor material layer;
a second alternating stack of second insulating layers and second electrically conductive layers overlying the first alternating stack;
a first memory opening extending through the first alternating stack and including a first memory film at a peripheral portion thereof;
a second memory opening extending through the second alternating stack and including a second memory film at a peripheral portion thereof;
a vertical semiconductor channel extending through the first memory opening and the second memory opening and contacting inner sidewalls of the first memory film and the second memory film, wherein the first memory film comprises a horizontal annular portion that laterally protrudes inward from a bottom end of a cylindrical portion of the first memory film; and
at least one feature selected from:
(a) first feature in which:
the vertical semiconductor channel contacts an annular top surface of the horizontal annular portion of the first memory film; and
a top of the first memory film does not contact an inner tip of a horizontal annular portion that laterally protrudes inward from a bottom end of a cylindrical portion of the second memory film; or
(b) a second feature in which:
the second memory film comprises a horizontal annular portion that laterally protrudes inward from a bottom end of a cylindrical portion of a respective second memory film, and wherein the vertical semiconductor channel comprises a first laterally undulating portion contacting the horizontal annular portion of the first memory film and a second laterally undulating portion contacting a horizontal annular portion of the second memory film;
each of the first memory films comprises a layer stack including a first charge storage layer and a first tunneling dielectric layer; and
each of the second memory films comprises a layer stack including a second charge storage layer and a second tunneling dielectric layer; or
(c) a third feature comprising a support pillar structure located in a support opening and containing a sacrificial dielectric liner located between a dummy memory film and a dummy vertical semiconductor channel, wherein the sacrificial dielectric liner is omitted between the memory film and the vertical semiconductor channel in the first memory opening.

17. The three-dimensional semiconductor device of claim 16, wherein the at least one feature comprises the first feature.

18. The three-dimensional semiconductor device of claim 16, wherein the at least one feature comprises the second feature.

19. The three-dimensional semiconductor device of claim 16, wherein the at least one feature comprises the third feature.

* * * * *